(12) United States Patent
Maki et al.

(10) Patent No.: US 6,829,750 B2
(45) Date of Patent: Dec. 7, 2004

(54) PASS-TRANSISTOR VERY LARGE SCALE INTEGRATION

(75) Inventors: Gary K. Maki, Albuquerque, NM (US); Prakash R. Bhatia, Albuquerque, NM (US)

(73) Assignee: Science & Technology Corporation @ UNM, Albuquerque, NM (US)

( * ) Notice: Subject to any disclaimer, the term of this patent is extended or adjusted under 35 U.S.C. 154(b) by 201 days.

(21) Appl. No.: 10/172,742

(22) Filed: Jun. 14, 2002

(65) Prior Publication Data

US 2003/0085738 A1 May 8, 2003

Related U.S. Application Data

(60) Provisional application No. 60/298,832, filed on Jun. 15, 2001.

(51) Int. Cl.[7] .................. G06F 17/50; G06F 9/45; H03K 19/094
(52) U.S. Cl. ................ 716/3; 716/8; 326/113
(58) Field of Search ............................ 716/1–4, 7–12, 716/18; 326/113, 120

(56) References Cited

U.S. PATENT DOCUMENTS

| | | | |
|---|---|---|---|
| 4,566,064 A | * | 1/1986 | Whitaker ............... 326/38 |
| 4,912,348 A | * | 3/1990 | Maki et al. ........... 326/113 |
| 5,040,139 A | | 8/1991 | Tran |
| 5,051,917 A | | 9/1991 | Gould et al. |
| 5,162,666 A | | 11/1992 | Tran |
| 5,200,907 A | | 4/1993 | Tran |
| 5,225,991 A | | 7/1993 | Dougherty |
| 5,349,659 A | | 9/1994 | Do et al. |
| 5,526,276 A | | 6/1996 | Cox et al. |
| 5,548,231 A | | 8/1996 | Tran |
| 5,581,202 A | | 12/1996 | Yano et al. |
| 5,596,742 A | | 1/1997 | Agarwal et al. |
| 5,649,165 A | | 7/1997 | Jain et al. |
| 5,712,806 A | | 1/1998 | Hennenhoefer et al. |
| 5,780,883 A | | 7/1998 | Tran et al. |
| 5,796,128 A | | 8/1998 | Tran et al. |
| 5,805,462 A | | 9/1998 | Poirot et al. |
| 5,808,483 A | | 9/1998 | Sako |
| 5,859,547 A | | 1/1999 | Tran et al. |
| 5,894,227 A | | 4/1999 | Acuff |
| 5,953,519 A | | 9/1999 | Fura |
| 5,955,912 A | | 9/1999 | Ko |
| 5,987,086 A | | 11/1999 | Raman et al. |
| 6,051,031 A | | 4/2000 | Shubat et al. |
| 6,173,435 B1 | | 1/2001 | Dupenloup |
| 6,184,718 B1 | | 2/2001 | Tran et al. |
| 6,185,719 B1 | | 2/2001 | Sako |
| 6,205,572 B1 | | 3/2001 | Dupenloup |

(List continued on next page.)

OTHER PUBLICATIONS

Buch et al., "Logic Synthesis for Large Pass Transistor Circuits," 1997 IEEE/ACM Int'l Conference on CAD, pp. 663–670.*

(List continued on next page.)

*Primary Examiner*—Leigh M. Garbowski
(74) *Attorney, Agent, or Firm*—Townsend and Townsend and Crew LLP

(57) ABSTRACT

Logic elements are provided that permit reductions in layout size and avoidance of hazards. Such logic elements may be included in libraries of logic cells. A logical function to be implemented by the logic element is decomposed about logical variables to identify factors corresponding to combinations of the logical variables and their complements. A pass transistor network is provided for implementing the pass network function in accordance with this decomposition. The pass transistor network includes ordered arrangements of pass transistors that correspond to the combinations of variables and complements resulting from the logical decomposition. The logic elements may act as selection circuits and be integrated with memory and buffer elements.

21 Claims, 17 Drawing Sheets

U.S. PATENT DOCUMENTS

| | | |
|---|---|---|
| 6,263,483 B1 | 7/2001 | Dupenloup |
| 6,275,973 B1 | 8/2001 | Wein |
| 6,282,695 B1 | 8/2001 | Reddy et al. |
| 6,288,593 B1 | 9/2001 | Tran et al. |
| 6,289,491 B1 | 9/2001 | Dupenloup |
| 6,289,498 B1 | 9/2001 | Dupenloup |
| 6,292,931 B1 | 9/2001 | Dupenloup |
| 6,295,636 B1 | 9/2001 | Dupenloup |
| 6,356,112 B1 | 3/2002 | Tran et al. |
| 6,467,074 B1 | 10/2002 | Katsioulas et al. |
| 6,496,956 B2 * | 12/2002 | Sako .............................. 716/3 |
| 2002/0069396 A1 | 6/2002 | Bhattacharya et al. |
| 2002/0087939 A1 | 7/2002 | Greidinger et al. |
| 2002/0162078 A1 * | 10/2002 | Boppana et al. ................ 716/1 |

OTHER PUBLICATIONS

Yano, Kazuo, et al., "Lean Integration: Achieving a Quantum Leap in Performance and Cost of Logic LSIs," IEEE 1994 Custom Integrated Circuits Conference, pp. 603–606.

Fletcher, William I., *An Engineering Approach to Digital Design*, MSI and LSI Circuits and Their Applications, 1980, Prentice–Hall, Inc., Englewood Cliffs, NJ, pp. 210–226.

Bhatia, Prakash R. and Maki, Gary, *Static Dynamic and Delay Hazard Free Pass Transistor Logic*, 6th NASA Symposium on VLSI Design, 1997, pp. 7.2.1–7.2.17, University of New Mexico, Albuquerque, New Mexico.

Devadas, S. Optimal Layout Via Boolean Satisfiability, 1989 IEEE International Conference on Computer–Aided Design Nov. 5, 1989, pp. 294–297.

Falkowski, B.J. et al., Efficient Algorithms For the Calculation of Arithmetic Spectrum from OBDD and Synthesis of OBDD from Arithmetic Spectrum for Incompletely Specified Boolean Functions 1994 IEEE International Symposium on Circuits and Systems, May 30, 1994, vol. 1, pp. 197–200.

Method for Identifying Technology Primitive in Logic IBM Technical Disclosure Bulletin, May 1992 Vo. 34, No. 12, pp. 359–361.

Upton, M. et al. Integrated Placement for Mixed Macro Cell and Standard Cell Design Proceedings of 27th ACM/IEEE Designs Automation Conference, Jun. 24, 1990, pp. 32–35.

* cited by examiner

| $x_1$ | $x_2$ | $x_3$ | $y$ | Pass Function |
|---|---|---|---|---|
| 0 | 0 | 0 | 0 | $x_1, x_2, x_3, 0$ |
| 0 | 0 | 1 | 1 | $\overline{x_1}, \overline{x_2}, x_3, 1$ |
| 0 | 1 | 0 | 1 | $\overline{x_1}, x_2, \overline{x_3}, 1$ |
| 0 | 1 | 1 | 0 | $x_1, \overline{x_2}, \overline{x_3}, 0$ |
| 1 | 0 | 0 | 1 | $x_1, \overline{x_2}, \overline{x_3}, 1$ |
| 1 | 0 | 1 | 0 | $\overline{x_1}, x_2, \overline{x_3}, 0$ |
| 1 | 1 | 0 | 0 | $\overline{x_1}, \overline{x_2}, x_3, 0$ |
| 1 | 1 | 1 | 1 | $x_1, x_2, x_3, 1$ |
FIG. 1D
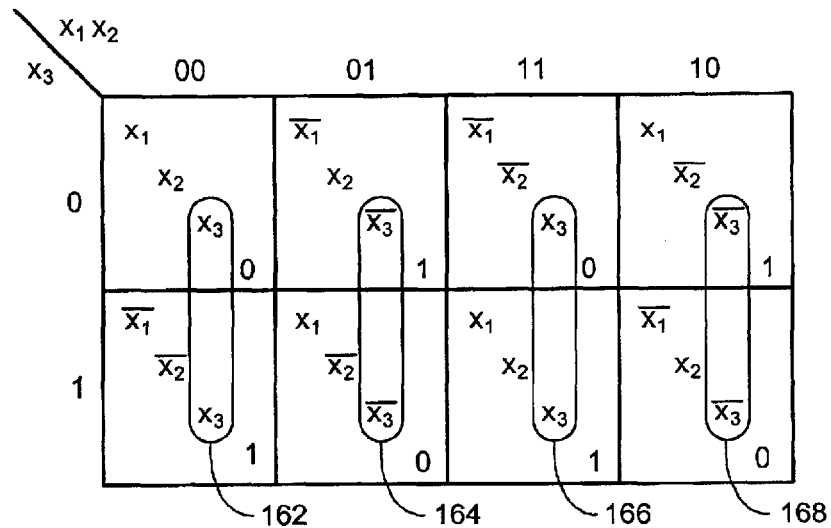
FIG. 1E
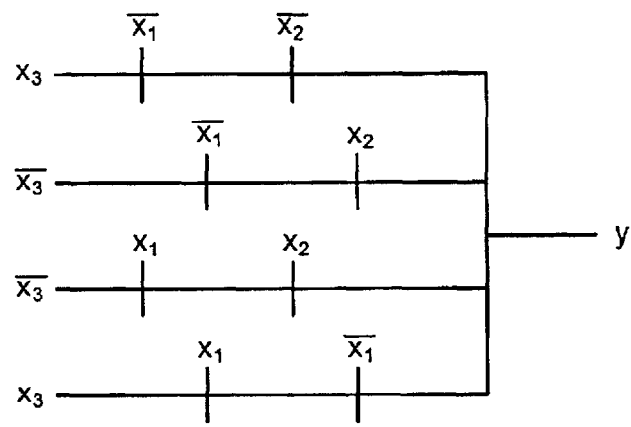
FIG. 1F

| $X_1$ | $X_2$ | Quadrant |
|---|---|---|
| 0 | 0 | North |
| 0 | 1 | West |
| 1 | 0 | East |
| 1 | 1 | South |

| $X_1$ | $X_2$ | $X_3$ | Octants |
|---|---|---|---|
| 0 | 0 | 0 | N |
| 0 | 0 | 1 | NE |
| 0 | 1 | 0 | E |
| 0 | 1 | 1 | SE |
| 1 | 0 | 0 | S |
| 1 | 0 | 1 | SW |
| 1 | 1 | 0 | W |
| 1 | 1 | 1 | NW |

| $X_1$ | $X_2$ | $X_3$ | ZOUT |
|---|---|---|---|
| 0 | 0 | 0 | $I_0$ |
| 0 | 0 | 1 | $I_1$ |
| 0 | 1 | 0 | $I_2$ |
| 0 | 1 | 1 | $I_3$ |
| 1 | 0 | 0 | $I_4$ |
| 1 | 0 | 1 | $I_5$ |
| 1 | 1 | 0 | $I_6$ |
| 1 | 1 | 1 | $I_7$ |

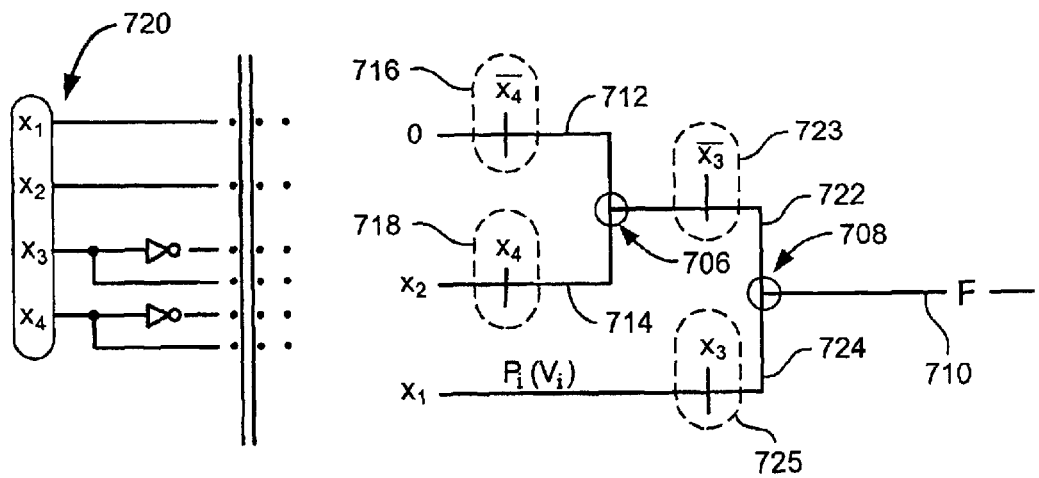
FIG. 7A
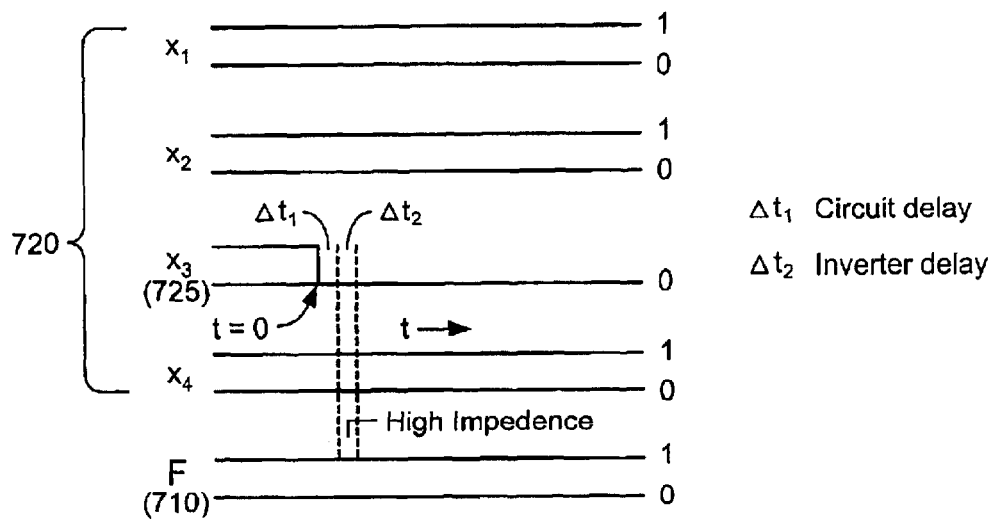
FIG. 7B
FIG. 7C

PASS-TRANSISTOR VERY LARGE SCALE INTEGRATION

CROSS-REFERENCES TO RELATED APPLICATIONS

This application is a nonprovisional of and claims priority to U.S. Prov. Pat. Appl. No. 60/298,832 entitled "MULTIPLEXOR-BASED DIGITAL DESIGN," filed Jun. 15, 2001 by Sterling R. Whitaker et al., the entire disclosure of which is herein incorporated by reference for all purposes.

This application is also related to the following commonly assigned, concurrently filed U.S. patent applications, each of which is also incorporated herein by reference in its entirety for all purposes: U.S. patent application Ser. No. 10/172,242, entitled "PASS-TRANSISTOR VERY LARGE SCALE INTEGRATION," by Gary K. Maki and Prakash R. Bhatia U.S. patent application Ser. No. 10/172,746, entitled "OPTIMIZATION OF DIGITAL DESIGNS," by Sterling R. Whitaker and Lowell H. Miles U.S. patent application Ser. No. 10/172,745, entitled "INTEGRATED CIRCUIT CELL LIBRARY," by Sterling R. Whitaker and Lowell H. Miles Ser. No. 10/172,743 entitled "DIGITAL LOGIC OPTIMIZATION USING SELECTION OPERATIONS," by Sterling R. Whitaker, Lowell H. Miles, Eric G. Cameron, and Jody W. Gambles U.S. patent application Ser. No. 10/172,744, entitled "DIGITAL CIRCUITS USING UNIVERSAL LOGIC GATES," by Sterling R. Whitaker, Lowell H. Miles, Eric G. Cameron, Gregory W. Donohoe, and Jody W. Gambles. These applications are sometimes referred to herein as "the Universal-Logic-Gate applications."

STATEMENT AS TO RIGHTS TO INVENTIONS MADE UNDER FEDERALLY SPONSORED RESEARCH OR DEVELOPMENT

The U.S. Government has a paid-up license in this invention and the right in limited circumstances to require the patent owner to license others on reasonable terms as provided for by the terms of Grant No. NAGS-9152 awarded by NASA.

COPYRIGHT NOTICE

A portion of the disclosure of this patent document contains material that is subject to copyright and/or mask work protection. The copyrgiht and/or mask work owner has no objection to the facsimile reproduction of anyone of the patent document or the patent disclosure, as it appears in the Patent and Trademark Office patent file or records, but otherwise reserves all copyright and/or mask work rights whatsoever.

BACKGROUND

This application relates generally to integrated circuits and relates more specifically to integrated circuits that include pass transistors.

Pass-transistor networks may be used in the formation of integrated circuits, particularly in metal-oxide-semiconductor ("MOS") very large scale integration ("VLSI") logic circuits. A pass transistor is a logical element used to block or conduct logic signals via a control terminal. When the control terminal is active, the logic level presented at the input is passed to the output. When the control terminal is inactive, the output is floating or in a high-impedance state. A pass-transistor network is a logic network formed by joining the inputs and outputs of sets of pass transistors.

As demands on the functional capabilities of integrated circuits continue to increase, so does a general need both to decrease their size and to improve their performance. One factor that may affect the size of the circuit is the manner in which individual elements are laid out. A factor that may affect the performance of the circuit is the presence of hazards, which are generally undesirable transients such as spikes of glitches that are precipitated by unequal path delays.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and is enclosed in parentheses or following a hyphen to denote one of multiple similar components. When reference is made to a reference numeral without specification to an existing sublabel, it is intended to refer to all such multiple similar components.

FIG. 1D is an example of a three-variable truth table for a hypothetical pass network;

FIG. 1E is a three-variable Karnaugh map corresponding to the truth table of FIG. 1D;

FIG. 1F is a schematic representation of a three-variable pass network corresponding to the Karnaugh map of FIG. 1F;

FIG. 7A shows an example of a BTS Karnaugh map of the present invention, corresponding to a BTS solution to the static hazard illustrated in FIG. 4A;

FIG. 7B shows a BTS pass network corresponding to the BTS Karnaugh map of FIG. 7A;

FIG. 7C shows a timing diagram illustration of how the BTS pass network of FIG. 7B eliminates the static-1 hazard of FIG. 4A;

DETAILED DESCRIPTION OF THE INVENTION

Figure 1A:
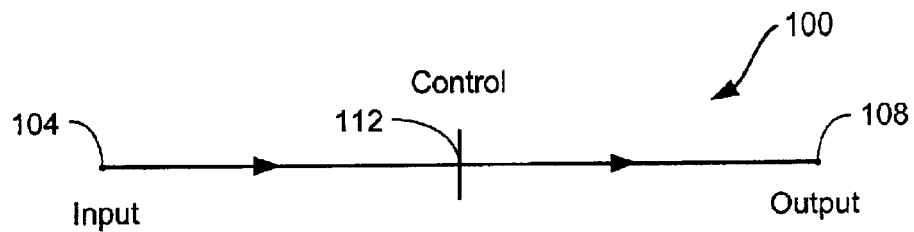
FIG. 1A is a schematic representation of a pass transistor.

Embodiments of the invention are thus directed to logic elements that permit reductions in layout size and the avoidance of hazards. Such logic elements may be included in libraries of logic cells. In one embodiment, a logical function to be implemented by the logic element is decomposed about a plurality of logical variables to identify factors corresponding to combinations of the logical variables and their complements. For example, if the decomposition is to be performed about k logical variables, there may be as many as $2^k$ factors resulting from all possible combinations between of the variables and complements. A pass transistor network is then provided for implementing the pass network function in accordance with this decomposition. The pass transistor network includes a plurality of ordered arrangements of pass transistors laid out from a position that corresponds to an output of the pass transistor network. In one embodiment, the pass transistors may be laid out substantially radially from the position. Each ordered arrangement comprises a plurality of pass transistors that corresponds to one of the combinations of variables and complements resulting from the logical decomposition. Accordingly, in one embodiment no more than one of the ordered arrangements is active at any one time. Each of the factors identified in the decomposition may be provided in the logic element as a sub-network in communication with the ordered arrangement corresponding to that factor.

The structure of such a sub-network may also differ in some embodiments. For example, in one embodiment, a further decomposition is performed of each of the corresponding factor according to other logical variables in the logical function. The sub-network then implements the function by using a similar structure used for the overall network. Ordered sub-arrangements of pas transistors are laid out substantially radially from a position corresponding to an output of the sub-network. Each of the ordered sub-arrangements corresponds to a combination of the other logical variables and their complements. In another embodiment, the sub-network is laid out as a binary tree of pass transistors.

In further embodiments of the invention, a logic element is provided with a memory element, a buffer element, and a selection circuit operationally connected with the memory element and buffer element. The selection circuit comprises a network of pass transistors distributed to implement the pass network function for selecting one of a plurality of inputs to be transmitted as the output. The selection circuit is configured to be free of at least one of a static hazard, a dynamic hazard, and a delay hazard, and is in some embodiments free of each of such hazards. In one embodiment, the network may be configured as a binary tree structure and in another embodiments may be by using a plurality of sequential arrangement laid out substantially radially to implement a logical decomposition of the pass network function.

1. Pass-Transistor Logic

FIG. 1A provides a schematic representation of a pass transistor 100. A control terminal 112 is used to block or conduct an input logic signal 104 to an output 108. When the control terminal 112 is active, the logic level of the input 104 is passed to the output 108, but when the control terminal is inactive, the output 108 is in a high-impedance state. The output 108 of the pass transistor 100 may therefore exhibit one of three logic states—"0," "1," or high-impedance state "Z." Generally, pass-transistor logic may be implemented using either n-MOS or p-MOS transistors. While FIG. 1A and the discussion below use examples of implementations with n-MOS transistors, it will be evident to those of skill in the art how to perform corresponding implementation with p-MOS transistors.

Figure 1B:
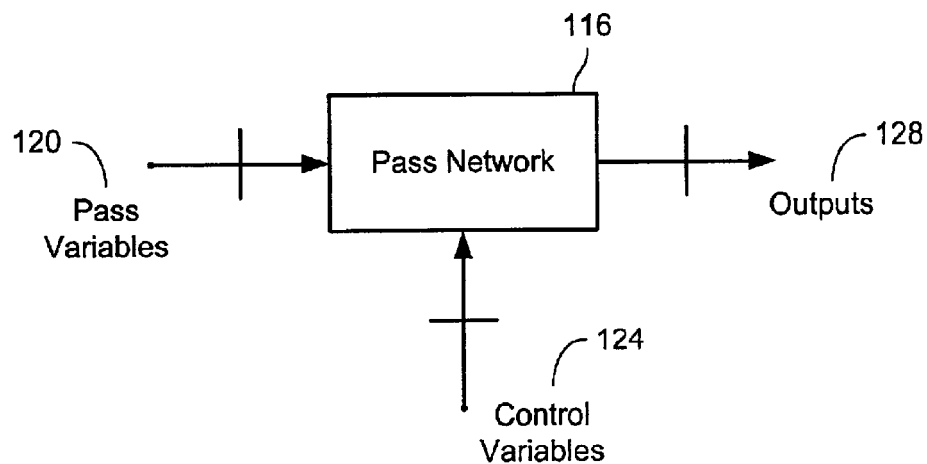
FIG. 1B is a schematic representation of a general pass-transistor network block.

FIG. 1B provides a schematic representation of a general pass-transistor network block. A pass network 116 is a logic network formed by joining pass transistor outputs 108 and inputs 104. Individual pass-transistor inputs (such as input 104 in FIG. 1A) from a plurality of pass transistors collectively form a set of pass variables 120. Similarly, individual pass-transistor control terminals (such as control 112 in FIG. 1A) collectively form a set of control variables 116 for the pass network 116. The pass-transistor outputs (such as output 108 in FIG. 1A) may also be directly joined together to form a set of outputs 128, provided that al of the paths to a group of joined outputs are passing the same logic state. This is to avoid conflicts between logic states of the paths.

Figure 1C:
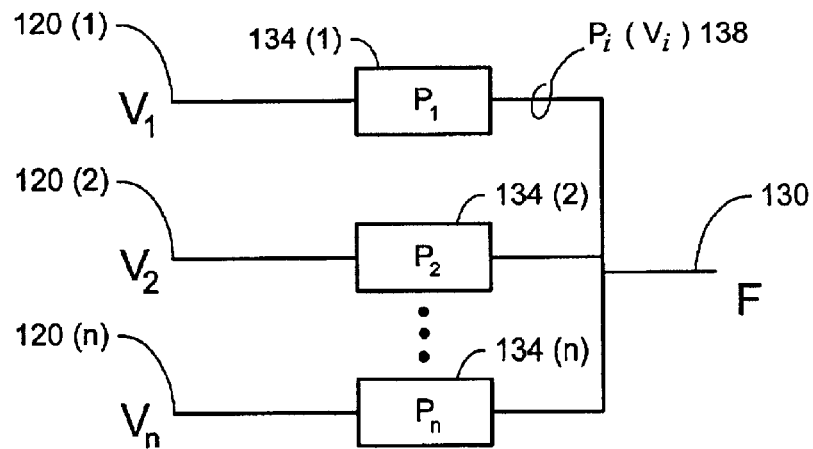
FIG. 1C is a schematic representation of a pass network.

FIG. 1C is a schematic representation of a pass network. The "control pass function" is a product term $P_1$ 134(i). Each literal $P_i$ 134(i) is asserted to pass the input variable $V_i$ 120(i), termed the "pass variable," to the output 130. The output 130 of the pass network is denoted $$F = \sum_{i=1}^{n} P_i(V_i),$$

with each $P_i(V_i)$ 138 being referred to as a corresponding "pass implicant." When all the literals in $P_i$ 130 are asserted, then the pass variables $V_i$ 120 are passed to the output F.

An illustration of how to implement a pass network from a truth table is shown in FIGS. 1D–1F. An exemplary three-variable truth table is shown in FIG. 1D using independent variables $x_1$, $x_2$, and $x_3$. A logic function is derived by Karnaugh-map minimization techniques and expressed in the form of a sum of products. When any minterm $P_i$ is true, the output is asserted high. The logic function that defines the output of the circuit can thus be expressed as $$F_1 = \sum_{i=1}^{n} P_i(1).$$

The circuit output is 0 when all the prime implicants $P_i$ of the logic function become false. Since the pass network element produces the high-impedance state at the output when all terms of $P_i$ are false, both 0's and 1's are passed to define the output fully. Using $Y_i$ to denote a minimized product term for a group of 0 outputs, $$F_0 = \sum_{i=1}^{m} Y_i(0),$$

so that the entire pass network is described as $$F = F_1 + F_0 = \sum_{i=1}^{n} P_i(1) + \sum_{j=1}^{m} Y_j(0).$$

Implementing a function directly from these equations results in classical CMOS logic gates, which are usually non-optimal. However, a pass network can be constructed such that $$V_i \in \{0, 1, x_1, \bar{x}_1, x_2, \bar{x}_2, \ldots, x_n, \bar{x}_n\},$$

permitting the pass network to take advantage of a larger set of potential pass variables in deriving a circuit. FIG. 1E thus shows a three-variable Karnaugh map corresponding to the truth table of FIG. 1D. The pass expression for this Karnaugh map is $$F = \bar{x}_1 \bar{x}_2(x_3) + \bar{x}_1 x_2(\bar{x}_3) + x_1 x_2(x_3) + x_1 \bar{x}_2(\bar{x}_3),$$

with the four terms respectively corresponding to groupings 162, 164, 166, and 168. From this expression, the three-variable pass network shown in FIG. 1F results from the Karnaugh map of FIG. 1D.

Figure 1G:
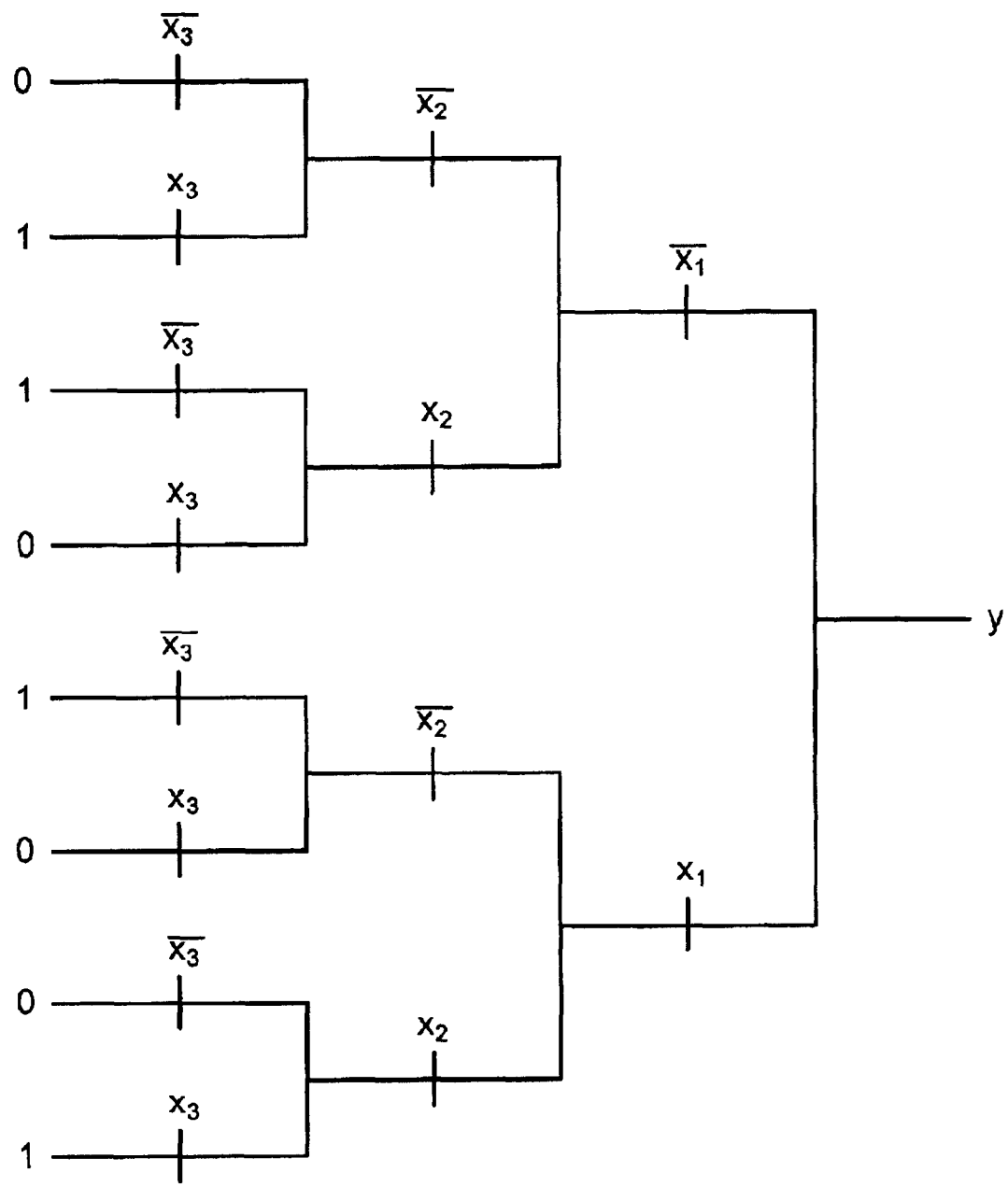
FIG. 1G is a schematic representation of a fall binary-tree-structured network corresponding to the truth table of FIG. 1D.

The pass network illustrated in FIG. 1F is an example of a partial binary-tree-structured ("BTS") network and is characterized by the fact that there are only two branches per node, with the control variable for each branch being the complement of the control variable for the other branch. FIG. 1G shows that the same truth table may alternatively be implemented with a full BTS network in which the network is only permitted to pass Boolean 0's and 1's. By removing the restriction that only Boolean 0's and 1's be passed, it is often possible for a partial BTS network, such as shown in FIG. 1F, to implement the same truth table with significantly fewer transistors than corresponding full BTS networks. This is evident by comparing the following expressions for F for the partial and full BTS implementations of the Karnaugh map shown in FIG. 1E:

$$F^{(full\ BTS)} = \bar{x}_1(\bar{x}_2(\bar{x}_3(0) + x_3(1)) + x_2(\bar{x}_3(1) + x_3(0))) + x_1(\bar{x}_2(\bar{x}_3(1) + x_3(0)) + x_2(\bar{x}_3(0) + x_3(1)))$$

$$F^{(partial\ BTS)} = \bar{x}_1(\bar{x}_2(x_3) + x_2(\bar{x}_3)) + x_1(\bar{x}_2(\bar{x}_3) + x_2(x_3)).$$

2. Universal Logic-Gate Library

Embodiments of the invention use cells of the universal-logic-gate library described in detail in the Universal-Logic-Gate applications, which have been incorporated by reference. Briefly, the universal-logic-gate library comprises many library cells based on a relatively small number of kernel cells. The kernel cells are combined into sets of basic cells, with the characteristics, properties, and operation of the high-level library cells being programmed from combinations of the basic cells. The flexibility of these basic cells is created by using universal-logic-gate structures. The high-level library cells may thus be configured to act as such diverse components as adders, multipliers, registers, barrel shifters, arithmetic logic units, comparators, decoders, multiplexors, state machines, counters, etc.

Each of the kernel cells may comprise one or more constituents selected from the group consisting of universal logic gates, memory, and buffers. In certain embodiments described herein, the universal logic gates are implemented with pass-transistor networks, although this is not a general requirement of the universal-logic-gate library. The pass-transistor networks may be programmed to implement any multivariable logic function using the principles described above, thereby permitting individual cells to implement equivalent logic that might otherwise require many classical logic gates organized in multiple levels. One consequence of this ability is a reduction in cell count and interconnect. In some embodiments, the memory cells comprise D flip flops, which may have synchronous, asynchronous, or clocked set and reset options. In some embodiments, the buffers may comprise tristating buffers.

The kernel cell layouts are drawn to allow useful combinations of these cells to be connected by abutment. In some embodiments, buffers may be added to the output of the flip flop and pass-network universal-logic-gate cells. In some embodiments, pass-network cells may directly drive the inputs of flip flops. Software has been written to generate the layout of such useful combinations of kernel cells to form a larger set of basic cells, which are then personalized by programming inputs to connect to logic high and low levels or to connect to external logic input signals. For example, the following register-transfer-language ("RTL") description can be programmed using a single basic cell:

```
if rising_edge (clock) then
    if reset = '1' then
        Q ⇐ '0'
    else
        if L = '1' then
            Q ⇐ A xor B;
        end if;
    end if;
end if;
```

An n=bit register with the illustrated characteristics may be constructed by arraying n of these programmed 1-bit cells. High-level functions, such as digital-signal-processor ("DSP") units are formed from arrays of the programmed basic cells. One consequence of this approach is that a relatively small number of simulations are sufficient to characterize the entire library of assembled cells. In addition, while most libraries are Boolean-based, most high-level design languages are not. The universal-logic gate naturally implements non-Boolean constructs such as if-then-else clauses and case statements. Higher-level constructs of the library may thus also directly implement many RTL constructs common to high-level design languages. In addition, modern logic synthesis tools normally try to generate the most area-efficient implementation of a function without a timing constraint. When programming a universal logic gate to perform a given function, there may be several functionally equivalent implementations that use the same minimum area. Such implementations, which usually operate at the same speed, may be differentiated by other characteristics such as power, interconnect, and fan-in load requirements. This permits more efficient circuits to be chosen based on more extensive criteria than simply the traditional area/speed tradeoff position.

Figure 2A:
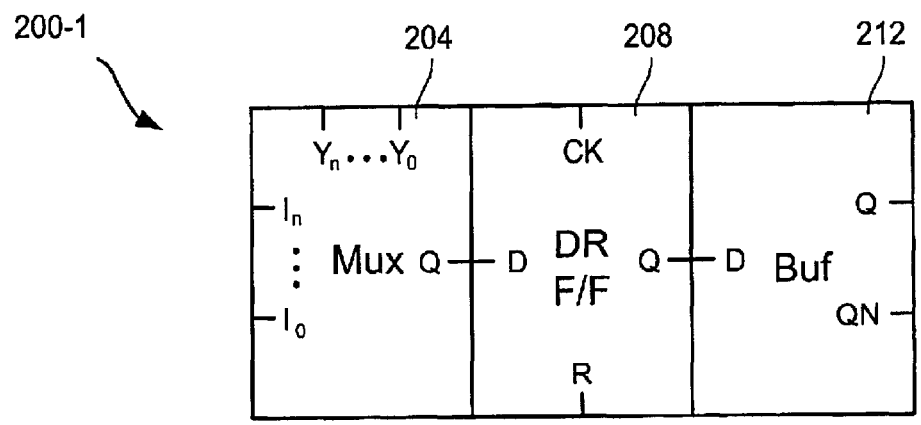
FIG. 2A is a block diagram of an embodiment of a basic cell composed of kernel cells.

Referring first to FIG. 2A, an embodiment of a basic cell 200 is shown in block diagram form. This embodiment includes all three of a ULG or selection circuit 204, a memory cell 208 and a buffer 212. Some of the kernel cell components of the basic cell 200 are shown in a generalized manner. The ULG 204 is shown having any number of data and selection control inputs, however the relationship between the maximum data inputs for a number of selection control inputs follows the following relationship $2^y=I$. The memory kernel cell 208 shown is a resetable D F/F. A buffer kernel cell 112 shown has both an inverting and non-inverting output, although, other buffer implementations will have either an inverting or non-inverting output.

The ULG 204 in this embodiment is implemented with a multiplexor. Multiplexors can be used to implement any Boolean function, but are not Boolean operators. Combinatorial logic in conventional designs is not implemented with selection functions, but uses Boolean logic gates. Further, multiplexors in conventional circuits are converted to Boolean equivalents during optimization as conventional ASIC libraries do not include selection circuits as cells.

The below Table I shows the fourteen kernel cells used in one embodiment:

TABLE I

| ULG Component | Symbol | Description |
|---|---|---|
| ULG | U | 8 to 1 (U8), 4 to 1 (U4) or 2 to 1 (U2) Multiplexors |
| Memory Cells | D | D F/F (D1) |
| | DR | Resetable D F/F - Rising Clock Synchronization (DR1), Negative Clock Synchronization (DR2) or Asynchronous (DR3) |
| | DS | Setable D F/F - Rising Clock Synchronization (DS1), Negative Clock Synchronization (DS2) or Asynchronous (DS3) |
| Buffers | B | Non-inverting buffer (B1) or Hybrid Inverting and Non-inverting buffer (B2) |
| | BN | Inverting buffer (BN1) |
| | CB | High-drive buffer (CB1) |
| | ZB | Tristatable buffer (ZB1) |

The embodiment of the kernel cells in the above Table I could be augmented in other embodiments to include other cells. The ULGs could include multiplexors of any size, for example, 16 to 1, 32 to 1, 64 to 1, etc. Larger multiplexors could be formed with a number of smaller multiplexors if a larger multiplexor is not supported in the kernel cells. Various other types of memory cells could also be supported such as EEPROM, EPROM, PROM, DRAM, SRAM, NVRAM, magnetic core memory, J-K F/Fs, setable and resetable F/Fs, various F/F with scan ATPG capability, etc. The J-K, setable, or resetable functionality of a F/F can be implemented by a D F/F and logic that can be embedded in the mux before or after the D F/F. Also the buffers could be of various strengths and sizes. Some buffers could support input and output pins of the chip with various thresholds, voltages, etc.

Table II lists the various configurations in which kernel cells are used to create basic cells 200-1 that use all of a ULG 204, a memory cell 208 and a buffer cell 212 such as the example in FIG. 2A. These basic cells 200-2 are the variations found in one embodiment of the ULG ASIC cell library.

TABLE II

| Basic Cell Type | Configuration Mux → Mem → Buf | Various Basic Cell Layout Names |
|---|---|---|
| UDB | U → D → B | U2D1B1, U4D1B1, U8D1B1, U2D1B2, U4D1B2, U8D1B2, |
| UDBN | U → D → BN | U2D1BN1, U4D1BN1, U8D1BN1 |
| UDZB | U → D → ZB | U2D1ZB1, U4D1ZB1, U8D1ZB1 |
| UDRB | U → DR → B | U2DR1B1, U2DR2B1, U2DR3B1, U2DR1B2, U2DR2B2, U2DR3B2, U4DR1B1, U4DR2B1, U4DR3B1, U4DR1B2, U4DR2B2, U4DR3B2, U8DR1B1, U8DR2B1, U8DR3B1, U8DR1B2, U8DR2B2, U8DR3B2 |
| UDRBN | U → DR → BN | U2DR1BN1, U2DR2BN1, U2DR3BN1, U4DR1BN1, U4DR2BN1, U4DR3BN1, U8DR1BN1, U8DR2BN1, U8DR3BN1 |
| UDRZB | U → DR → ZB | U2DR1ZB1, U2DR2ZB1, U2DR3ZB1, U4DR1ZB1, U4DR2ZB1, U4DR3ZB1, U8DR1ZB1, U8DR2ZB1, U8DR3ZB1 |
| UDSB | U → DS → B | U2DS1B1, U2DS2B1, U2DS3B1, U2DS1B2, U2DS2B2, U2DS3B2, U4DS1B1, U4DS2B1, U4DS3B1, U4DS1B2, U4DS2B2, U4DS3B2, U8DS1B1, U8DS2B1, U8DS3B1, U8DS1B2, U8DS2B2, U8DS3B2 |
| UDSBN | U → DS → BN | U2DS1BN1, U2DS2BN1, U2DS3BN1, U4DS1BN1, U4DS2BN1, U4DS3BN1, U8DS1BN1, U8DS2BN1, U8DS3BN1 |

TABLE II-continued

| Basic Cell Type | Configuration Mux → Mem → Buf | Various Basic Cell Layout Names |
|---|---|---|
| UDSZB | U → DS → ZB | U2DS1ZB1, U2DS2ZB1, U2DS3ZB1, U4DS1ZB1, U4DS2ZB1, U4DS3ZB1, U8DS1ZB1, U8DS2ZB1, U8DS3ZB1 |

Figure 2B:
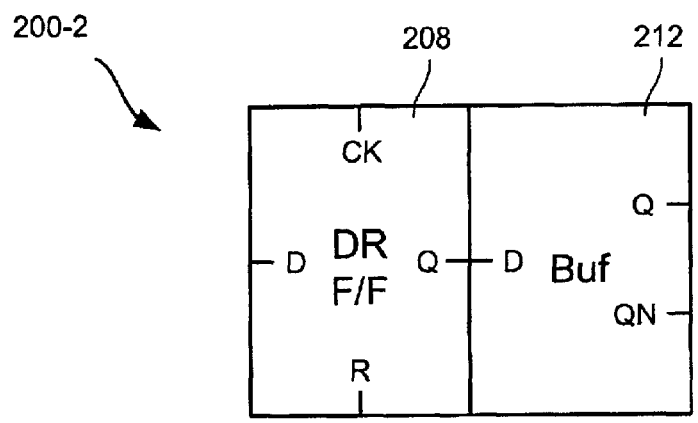
FIG. 2B is a block diagram of another embodiment of a basic cell composed of a memory and a buffer kernel cells.

With reference to FIG. 2B, a block diagram of another embodiment of a basic cell 200-2 composed of memory and buffer kernel cells 208, 212 is shown. This is but one example of a basic cell 200-2 of this general configuration. Other basic cells of this general configuration that could be found in an embodiment of a ULG ASIC cell library are listed in Table III.

TABLE III

| Basic Cell Type | Configuration Memory → Buffer | Various Basic Cell Layout Names |
|---|---|---|
| DB | D → B | D1B1, D1B2 |
| DBN | D → BN | D1BN1 |
| DZB | D → ZB | D1ZB1 |
| DRB | DR → B | DR1B1, DR2B1, DR3B1, DR1B2, DR2B2, DR3B2 |
| DRBN | DR → BN | DR1BN1, DR2BN1, DR3BN1 |
| DRZB | DR → ZB | DR1ZB1, DR2ZB1, DR3ZB1 |
| DSB | DS → B | DS1B1, DS2B1, DS3B1, DS1B2, DS2B2, DS3B2 |
| DSBN | DS → BN | DS1BN1, DS2BN1, DS3BN1 |
| DSZB | DS → ZB | DS1ZB1, DS2ZB1, DS3ZB1 |

Figure 2C:
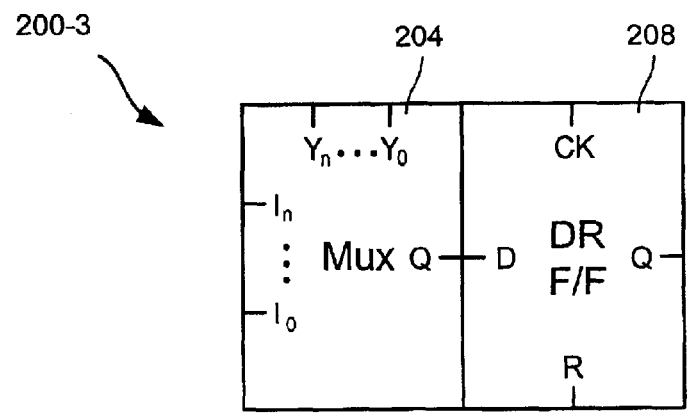
FIG. 2C is a block diagram of yet another embodiment of a basic cell composed of a selection and memory kernel cells.

Referring next to FIG. 2C, a block diagram of yet another embodiment of a basic cell 200-3 is shown that is composed of ULG and memory kernel cells 204, 208. This is just one example of the various similar basic cells 200-3 that might form an embodiment of the ULG ASIC cell library. Other possible configurations are enumerated in Table IV below.

TABLE IV

| Basic Cell Type | Configuration Mux → Mem | Various Basic Cell Layout Names |
|---|---|---|
| UD | U → D | U2D1, U4D1, U8D1 |
| UDR | U → DR | U2DR1, U4DR1, U8DR1, U2DR2, U4DR2, U8DR2, U2DR3, U4DR3, U8DR3 |
| UDS | U → DS | U2DS1, U4DS1, U8DS1, U2DS2, U4DS2, U8DS2, U2DS3, U4DS3, U8DS3 |

Figure 2D:
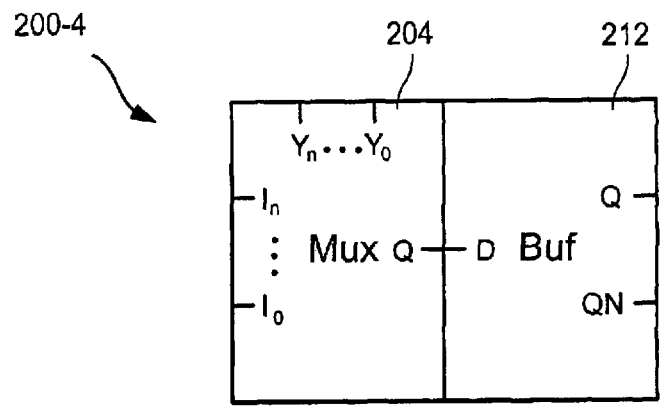
FIG. 2D is a block diagram of still another embodiment of a basic cell composed of a selection and a buffer kernel cells.

With reference to FIG. 2D, a block diagram of still another embodiment of a basic cell 200-4 composed of ULG and buffer kernel cells 204, 212 is shown. There are other possible configurations of this type of basic cell 200-4. The variations of this basic cell 200-4 for one embodiment of the ASIC library are listed in Table V. From Tables II–V, around 80% of the 142 available basic cells include ULG circuits. The 142 basic cells are based upon the 14 kernel cells of Table I.

Although the embodiment in Tables II–V show some possible basic cells, other embodiments could include additional basic cells. These additional basic cells could be optimized for output power, power consumption, layout area, response time, leakage, etc. such that there are multiple cells with the same logical properties, but that are optimized for particular circumstances. For example, there may be three non-inverting buffers of having different drives to support larger fanout and/or higher speeds.

TABLE V

| Basic Cell Type | Configuration Mux → Buf | Various Basic Cell Layout Names |
|---|---|---|
| UB | U → B | U2B1, U4B1, U8B1, U2B2, U4B2, U8B2 |
| UBN | U → BN | U2BN1, U4BN1, U8BN1 |

The building blocks of a digital circuit could be abstracted beyond the ULG ASIC cell library. In some embodiments, the ULG ASIC cell library components could be combined in higher-level macro cells such as adders, multipliers, registers, barrel shifters, ALUs, comparators, decoders, state machines, counters, etc. There could be thousands of possible macro cells. Further, designs can be abstracted to a level higher than the macro cells by using cores that implement higher level functions such as microprocessors, graphics processors, interface busses or ports, digital signal processors, etc. These cores could use macro cells and/or components from the ULG ASIC cell library. Often the cores are written in a hardware description language (HDL) than can be synthesized easily to any ULG ASIC cell library for a particular process.

Figure 2E:
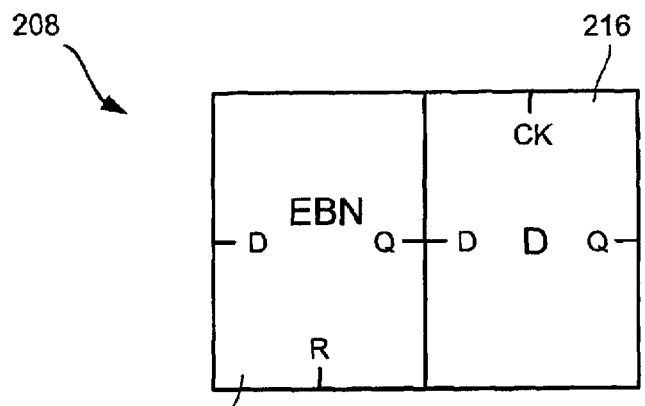
FIG. 2E is a block diagram of an embodiment of a memory cell with a synchronous reset.
Figure 2F:
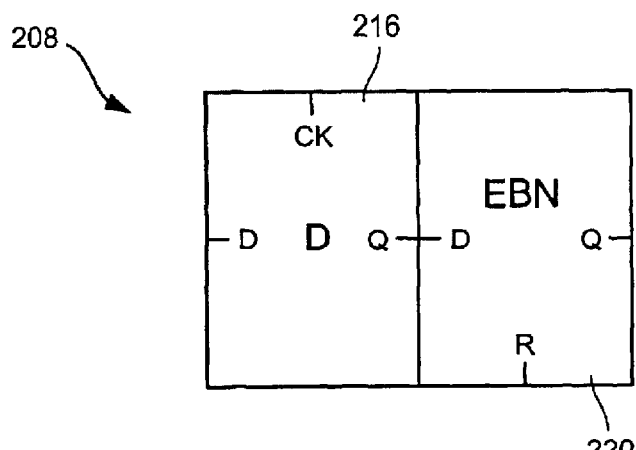
FIG. 2F is a block diagram of another embodiment of a memory cell with an asynchronous reset.

With reference to FIGS. 2E and 2F, various embodiments of a memory kernel cell 208 are shown in block diagram form. These embodiments divide the D F/F 216 out from the memory cell and implement some functionality with a separate buffer cell 220. In various embodiments, the buffer cell 220 could be used to customize the D F/F 216 with synchronous reset of FIG. 2E or asynchronous reset of FIG. 2F. In other embodiments, a separate circuit could be used to make a D F/F 216 behave as a setable D F/F, a J-K F/F or a F/F with scan capability. In other embodiments, the separate circuit could be implemented with a selection circuit.

This buffer cell 220 in an ASIC cell library could be used for other purposes also. For example, an 8 to 1 mux function could be implemented with a buffer cell 220 and a 4 to 1 mux 204 in some circumstances to reduce the chip area needed to implement the functionality. Table VI shows the thirteeen kernel cells used in this embodiment. Table VII shows a truth table for the enable buffer 204.

TABLE VI

| Kernel Cell Component | Symbol | Description |
|---|---|---|
| ULGs | U | 8 to 1 (U8), 4 to 1 (U4) or 2 to 1 (U2) Multiplexors |
| Memory Cells | D | D F/F (D1) |
| | DS | Setable D F/F - Rising Clock Synchronization (DS1), Negative Clock Synchronization (DS2) or Asynchronous (DS3) |
| Buffers | B | Non-inverting buffer (B1) or Hybrid Inverting and Non-inverting buffer (B2) |
| | BN | Inverting buffer (BN1) |
| | EBN | Inverting buffer with an enable input (EBN1) |
| | CB | High-drive buffer (CB1) |
| | ZB | Tristatable buffer (ZB1) |

TABLE VII

| R | D | Q |
|---|---|---|
| 0 | 0 | 1 |
| 0 | 1 | 1 |
| 1 | 0 | 1 |
| 1 | 1 | 0 |

3. Layout Issues

According to embodiments of the invention, the layout of library cells is constructed by decomposing a logic function into k distinct constituent logic sub-functions. Starting from a central point that may be used to define the position of the cell output, each of the logic sub-functions is laid out radially. Usually these radial spokes with be position to have equal angular separations 360°/k. Each of the sub-functions themselves may be decomposed into k' sub-sub-functions. The sub-sub-functions are then laid out radially from an end point of one of the radial spokes that defines an output of the corresponding sub-function. Usually, k'=k, although this is not a requirement. This basic layout process may be continued indefinitely, decomposing each of the sub-sub-functions into sub-sub-sub-functions, etc., giving the layout for relatively complex functions a certain fractal nature.

Figures 3A, 3B, 3C, 3D:
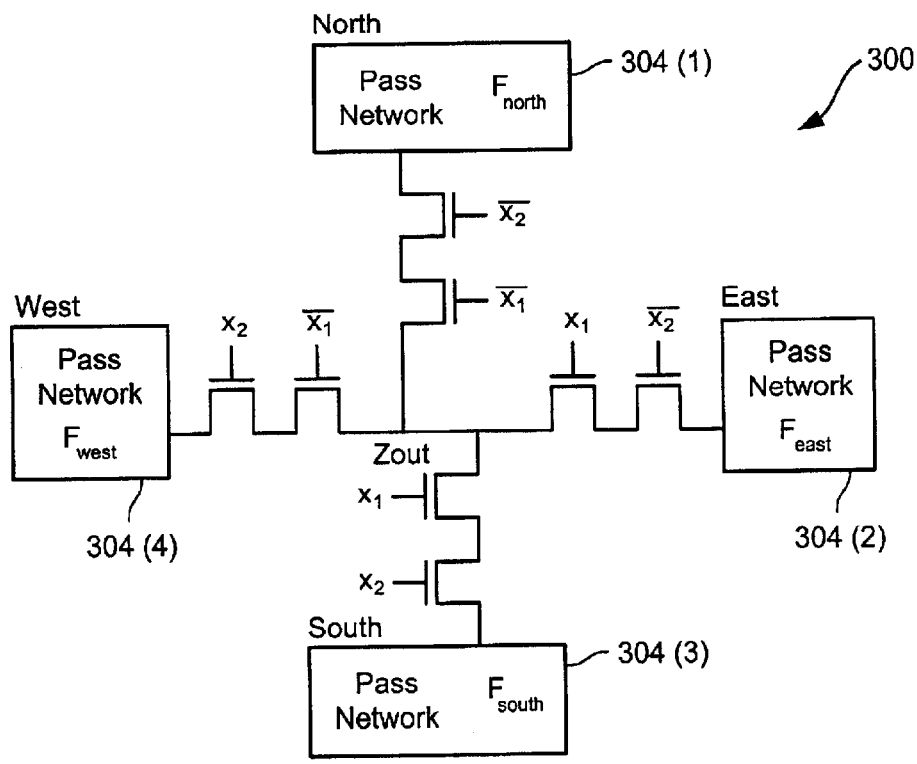
FIG. 3A illustrates a layout for a cell element using pass transistors in accordance with an embodiment of the invention.
FIGS. 3B and 3C provide layout assignments used in embodiments of the invention.
FIG. 3D provides a truth table for a multiplexor element.

The BTS decompositions of pass-transistor implementations thus permit embodiments in which k is an power of two, usually equal to 4 or 8 to take advantage of existing layout technologies. For example, FIG. 3A shows a general pass-transistor layout 300 for an embodiment in which k=4. In this embodiment, the output $Z_{out}$ is at the center of the cell element and the decomposition of the cell function is about $x_1$ and $x_2$. The four radial layouts thus correspond to the four possible values enumerated in FIG. 3B for the pass transistors associated with $x_1$ and $x_2$. The decomposition may thus be expressed as $$Z_{out} = x_1 x_2 (F_{south}) + x_1 \bar{x}_2 (F_{east}) + \bar{x}_1 x_2 (F_{west}) + \bar{x}_1 \bar{x}_2 (F_{north}),$$

with the designations "south," "east," "west," and "north" being used to define the different radial layouts. The terms $F_i$ are sometimes referred to herein as "factors" of the cell function resulting from the decomposition. This functional decomposition thus corresponds to the physical structure shown in FIG. 3A. In embodiments where the cell function is implemented with pass transistors, it is sometimes referred to herein as a "pass network function." Only one pass network is active at any time, the active pass network being determined by the pass variables $x_1$ and $x_2$. In the embodiment illustrated in FIG. 3A, the angular separations between the four radial layouts are substantially equal to each other, i.e. equal to about 90°, which is a preferred, but not required, configuration. Each of the quadrant functions $F_m$ may itself be decomposed in the same fashion and each of the corresponding pass networks 304 themselves thereby be laid out in a similar fashion.

FIG. 3C provides a similar table for a layout that could be performed in another embodiment in which k=8. In this embodiment, the output $Z_{out}$ would be at the center of the cell element, with the decomposition being about $x_1$, $x_2$, and $x_3$. The resulting eight radial layouts corresponding to the values enumerated in FIG. 3C thus define octants instead of quadrants in the layout. The decomposition in this embodiment may thus be expressed as $$Z_{out} = x_1 x_2 x_3 (F_{NW}) + x_1 x_2 \bar{x}_3 (F_W) + x_1 \bar{x}_2 x_3 (F_{SW}) + x_1 \bar{x}_2 \bar{x}_3 (F_S) + \bar{x}_1 x_2 x_3 (F_{SE}) +$$
$$\bar{x}_1 \bar{x}_2 x_3 (F_E) + \bar{x}_1 \bar{x}_2 \bar{x}_3 (F_{NE}) + \bar{x}_1 x_2 \bar{x}_3 (F_N),$$

where the radial layouts have again been identified with direction-based subscripts. In a similar fashion to that discussed for the quadrant layout, this decomposition results in a layout in which only one of eight pass networks is active at any time, the active pass network being determined by the pass variables $x_1$, $x_2$, and $x_3$. In alternative embodiments, these principles may be applied to design layouts using other values of k also.

The following examples illustrated various features of this layout scheme. In a first example, the logic function for the U8 logic cell of the universal-logic-gate library is considered. The U8 logic cell corresponds to an 8:1 multiplexor and has the following logic function:

$$Z_{out} = x_1 x_2 x_3 (I_7) + x_1 x_2 \bar{x}_3 (I_6) + x_1 \bar{x}_2 x_3 (I_5) + x_1 \bar{x}_2 \bar{x}_3 (I_4) + \bar{x}_1 x_2 x_3 (I_3) +$$
$$\bar{x}_1 x_2 \bar{x}_3 (I_2) + \bar{x}_1 \bar{x}_2 x_3 (I_1) + \bar{x}_1 \bar{x}_2 \bar{x}_3 (I_0),$$

where each $x_i$ controls the pass-gate input and $I_j$ denotes the pass variable. The truth table for this circuit is therefore as set forth FIG. 3D. Decomposing about $x_1$ and $x_2$ results in the following logic function:

$$Z_{out} = x_1 x_2 (x_3 (I_7) + \bar{x}_3 (I_6)) + x_1 \bar{x}_2 (x_3 (I_5) + \bar{x}_3 (I_4)) + \bar{x}_1 x_2 (x_3 (I_3) + \bar{x}_3 (I_2)) +$$
$$\bar{x}_1 \bar{x}_2 (x_3 (I_1) + \bar{x}_3 (I_0)),$$

in which each of the quadrant sub-functions is of the form $F_m = x_3(I_j) + \bar{x}_3(I_j)$. The U8 logic cell may thus be laid out in accordance with an embodiment of the invention as shown in FIG. 3C with this sub-function being implemented with each of the pass networks denoted 304.

Figure 3E:
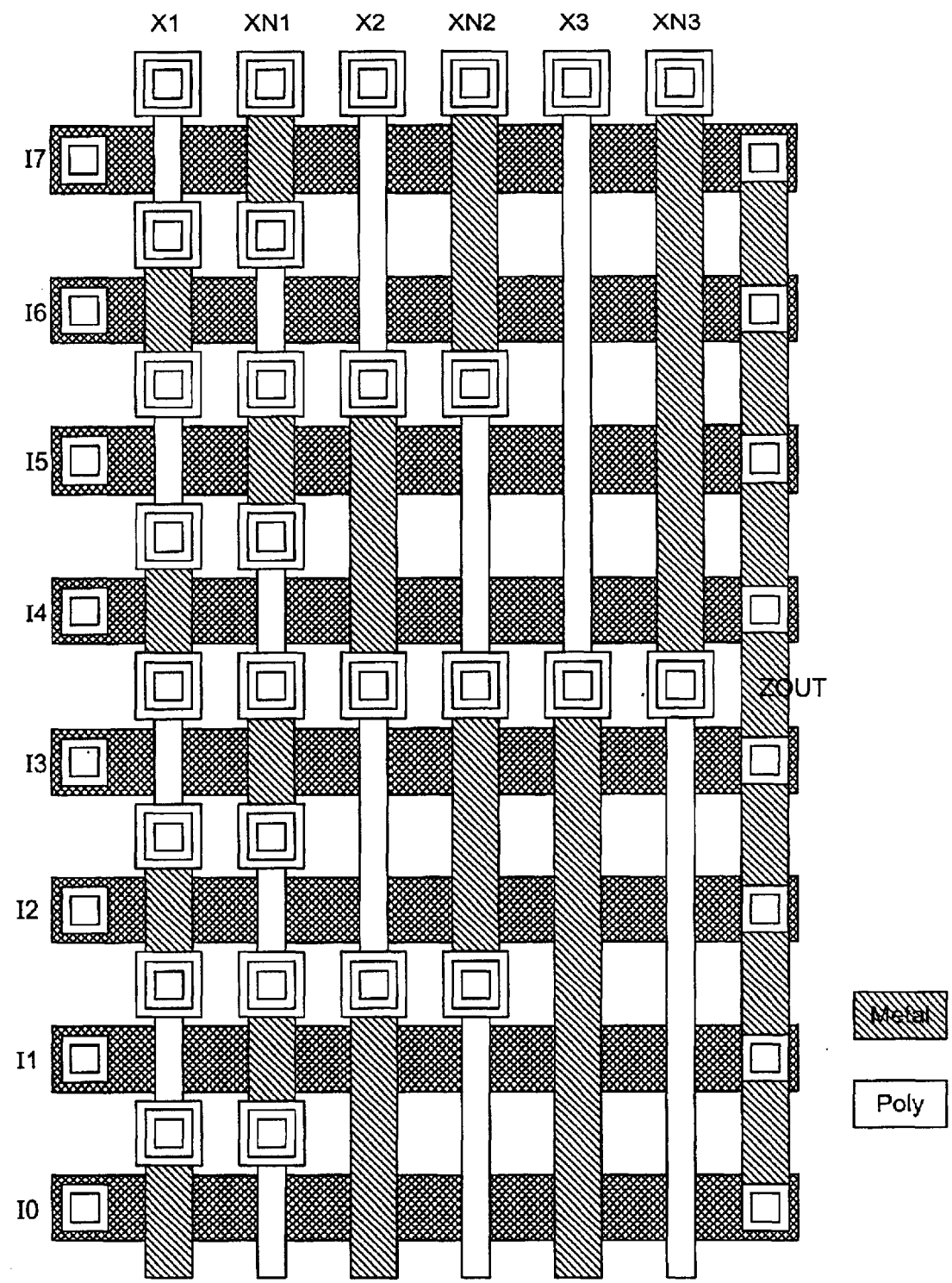
FIGS. 3E and 3F compare layouts for a multiplexor element to illustrate space savings in an embodiment.
Figure 3F:
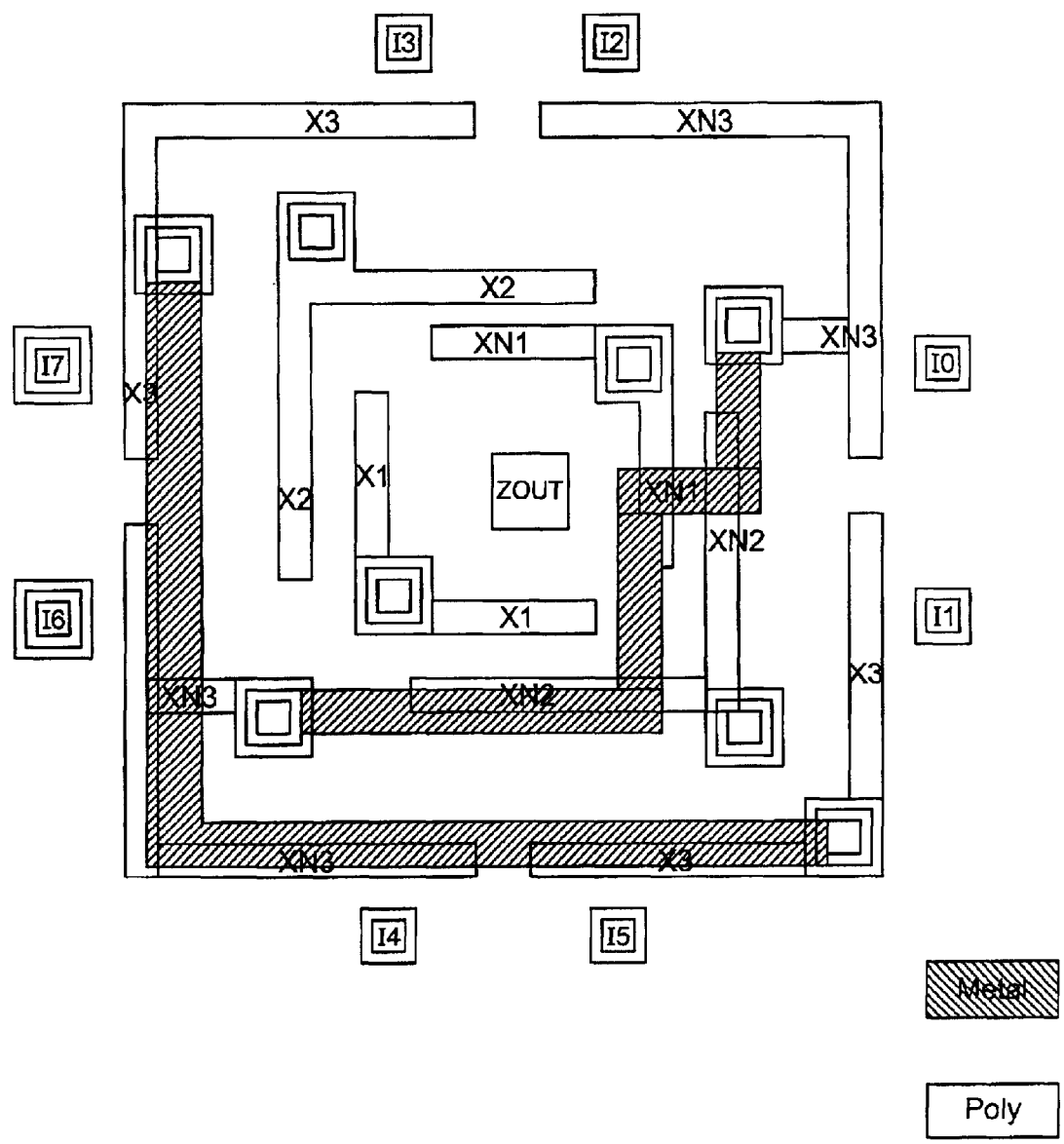

FIGS. 3E and 3F provide a comparison of a traditional pass-transistor layout of this function with the current layout. The traditional layout, shown in FIG. 3E requires 24 pass transistors and is shown as realized in a 0.35-$\mu$m CMOS process where only the n-MOS devices are shown and none of the inverters. Only one metal layer is used and the area is 167.32 $\mu$m$^2$. By contrast, the layout according to this embodiment of the invention is shown in FIG. 3F and uses only 16 pass transistors. Using the same 0.35-$\mu$m CMOS process, the area of this layout is only 106.07 $\mu$m$^2$, representing a savings of about 37% in this embodiment.

The same principles may be extended to a more complex circuit, such as the U16 universal-logic-gate cell that corresponds to a 16:1 multiplexor. Decomposing the logic function corresponding to this cell provides:

$$Z_{out} = x_1 x_2 (x_3 x_4 (I_{15}) + x_3 \bar{x}_4 (I_{14}) + \bar{x}_3 x_4 (I_{13}) + \bar{x}_3 \bar{x}_4 (I_{12})) +$$
$$x_1 \bar{x}_2 (x_3 x_4 (I_{11}) + x_3 \bar{x}_4 (I_{10}) + \bar{x}_3 x_4 (I_9) + \bar{x}_3 \bar{x}_4 (I_8)) +$$
$$\bar{x}_1 x_2 (x_3 x_4 (I_7) + x_3 \bar{x}_4 (I_6) + \bar{x}_3 x_4 (I_5) + \bar{x}_3 \bar{x}_4 (I_4)) +$$
$$\bar{x}_1 \bar{x}_2 (x_3 x_4 (I_3) + x_3 \bar{x}_4 (I_2) + \bar{x}_3 x_4 (I_1) + \bar{x}_3 \bar{x}_4 (I_0)).$$

Figure 3G:
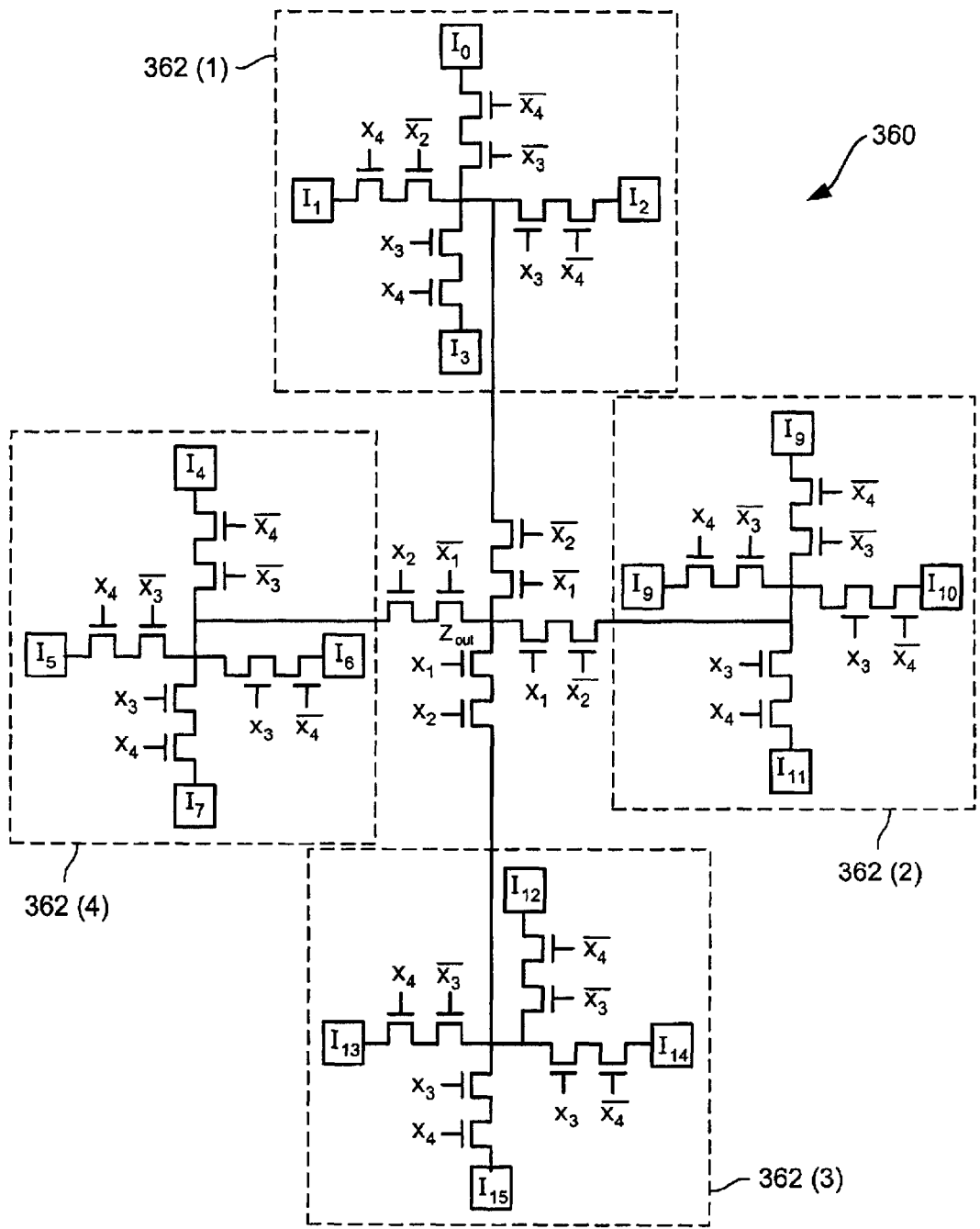
FIGS. 3G and 3H illustrates layout for a multiplexor element in accordance with embodiments of the invention.

Using the layout principles described above, this function may be effected by the circuit shown in FIG. 3G. In particular, this serves as an example of the fact that each of the sub-function pass networks 362 comprised by the layout 360 may themselves be laid out with the radial scheme described herein. As seen in FIG. 3G, the overall layout 360 is organized into quadrants defined by $x_1$ and $x_2$ and, within each quadrant, the corresponding pass network 362 is itself organized into quadrants defined by $x_3$ and $x_4$. Only one quadrant is active at any time, and additionally only one sub-quadrant of the active quadrant is active at any time, the active quadrant and sub-quadrant being determined by the pass variables $x_1$, $x_2$, $x_3$, and $x_4$.

A number of variations on the type of layout shown in FIG. 3G are also within the scope of the invention. For example, while FIG. 3G provides an example in which each level of decomposition is performed with the same number of pass variables, i.e. k=k'=4, this is not a requirement. For example, for a function using five pass variables, one level might be decomposed with three pass variables so that the layout at that level is structured into octants, while another level might be decomposed with two pass variables so that the layout at that level is structured into quadrants. Moreover, the decomposition is not limited to two levels and may be performed with more levels in appropriate circumstances.

The U16 cell is also useful for illustrating explicitly how the decomposition may be performed for three pass variables so that the corresponding layout is structured into octants. One possible decomposition using three pass variables is as follows:

$$Z_{out} = x_1 x_2 x_3 (x_4(I_{15}) + \bar{x}_4(I_{14})) + x_1 x_2 \bar{x}_3 (x_4(I_{13}) + \bar{x}_4(I_{12})) +$$
$$x_1 \bar{x}_2 x_3 (x_4(I_{11}) + \bar{x}_4(I_{10})) + x_1 \bar{x}_2 \bar{x}_3 (x_4(I_9) + \bar{x}_4(I_8)) +$$
$$\bar{x}_1 x_2 x_3 (x_4(I_7) + \bar{x}_4(I_6)) + \bar{x}_1 x_2 \bar{x}_3 (x_4(I_5) + \bar{x}_4(I_4)) +$$
$$\bar{x}_1 \bar{x}_2 x_3 (x_4(I_3) + \bar{x}_4(I_2)) + \bar{x}_1 \bar{x}_2 \bar{x}_3 (x_4(I_1) + \bar{x}_4(I_0)).$$

Figure 3H:
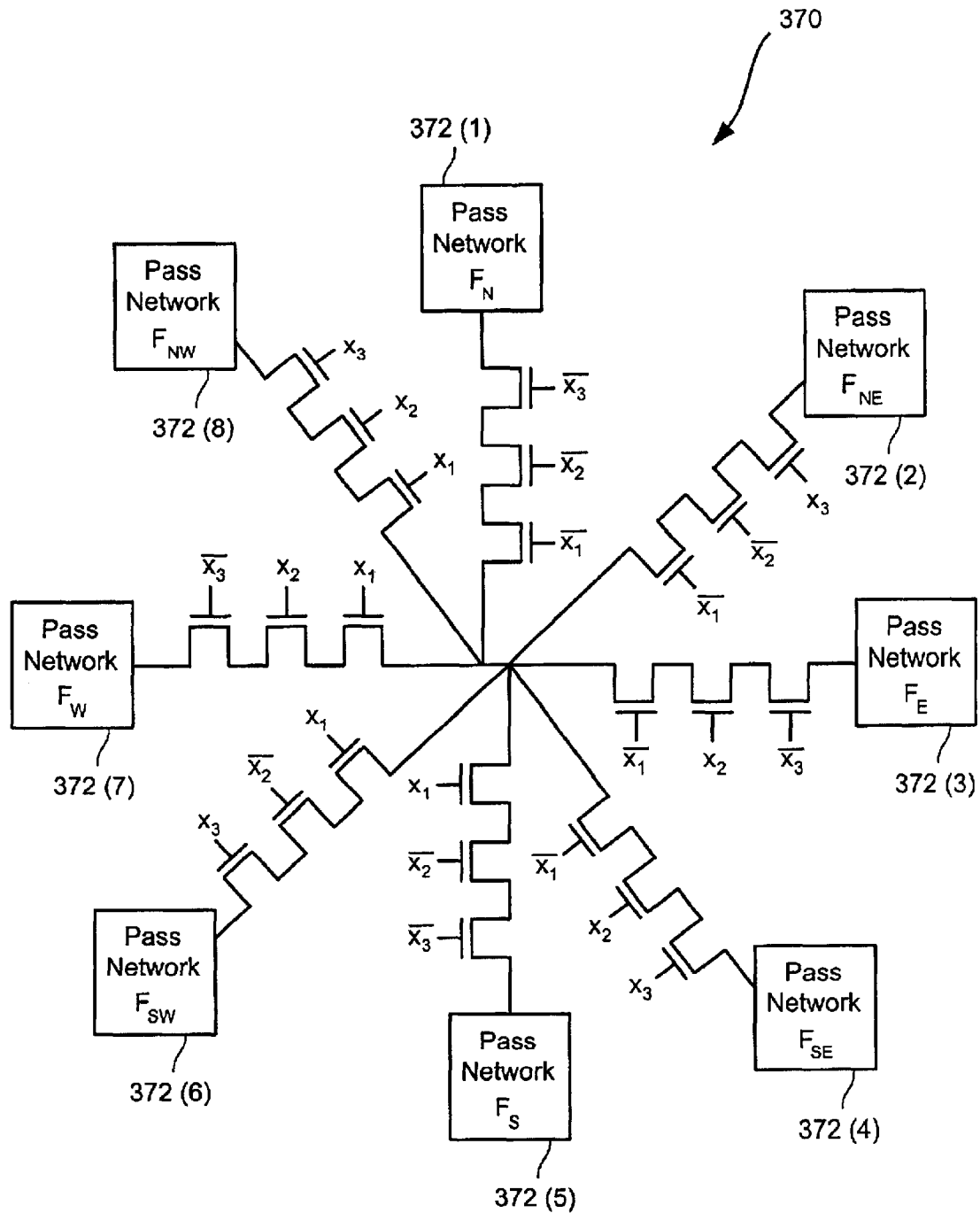

With this decomposition, the pass network 372 for each octant in the layout 370 shown in FIG. 3H has the form $F_m = x_4(I_j) + \bar{x}_4(I_l)$. Only one of the pass networks is active at any one time, the active octant being determined by the pass variables $x_1$, $x_2$, and $x_3$. It will also be evident that the decomposition for the U16 cell could alternatively been performed for any of the combinations of three pass variables, i.e. according to $x_1$, $x_2$, and $x_4$, according to $x_1$, $x_3$, and $x_4$, or according to $x_2$, $x_3$, and $x_4$.

4. Hazards

Embodiments of the invention also permit the elimination of certain hazards, which are unwanted switching transients that may appear at the output of a circuit because different paths in the circuit present different propagation delays. Non-zero delays through individual logic gates comprising the circuit paths are generally the cause of such propagation delays. If a transitory erroneous signal is fed back in an asynchronous sequential circuit, it may cause the circuit to make an incorrect transition to a wrong stable state. Three types of circuit hazards are eliminated in accordance with embodiments of the invention: static hazards, dynamic hazards, and delay hazards. A static hazard is single momentary transient in an output signal that should have remained static in response to an input change. If, in response to an input change and for some combination of propagation delays, a network output may momentarily go to "0" when it should remain a constant "1," then the network has a "static 1-hazard." Similarly, if the output may momentarily go to "1" when it should remain a constant "0," the network is said to have a "static 0-hazard." Additionally, if the circuit output is supposed to change from "0" to "1" (or "1" to "0") according to changes in the inputs, but the output changes three or more times before settling to its final value, then the network has a dynamic hazard.

Both static and dynamic hazards can be identified during the circuit design phase using a Karnaugh-map representation of the circuit's output function. These two types of hazards are therefore called logic hazards. In the field of digital design, the classical Karnaugh-map technique teaches grouping adjacent cells in the map with a minimum number of cell groups, thereby determining the minimum number of logic gates to construct a given circuit. The map pattern that forewarns a designer of the existence of a pending logic hazard is characterized by cell groupings that are adjacent to each other but are not overlapped. The classical solution to the logic-hazard problem is to cover adjacent cells with a redundant cell grouping that overlaps the two adjacent, but non-overlapping groupings. In this way, classical digital circuit design teaches the removal of static and dynamic hazards by adding redundant logic gates to the circuit, thereby increasing the complexity of the circuit.

The third type of hazard, a delay hazard, is a condition found in circuits free of logic hazards. It nevertheless produces an inappropriate sequence of output states in response to a sequence of two consecutive changes in the input state. Delay hazards are associated with speed independent circuits, which send back "ready" signals to the input source to indicate that a new input can be accepted. As with logic hazards, the classical solution to a potential delay hazard uses additional logic gates and therefore increases the complexity of the circuit.

a. Logic Hazards

Figure 4A:
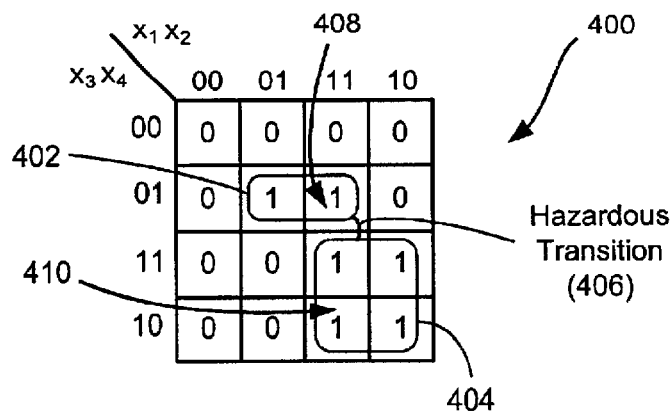
FIG. 4A shows a Karnaugh map illustrating the presence of a static 1-hazard in a combinational network.

FIG. 4A shows a Karnaugh map to illustrate the presence of a logic hazard, in this instance a static 1-hazard in a network. The occurrence of the static hazard is illustrated with a simple example implementing the function:

$$F(x_1, x_2, x_3, x_4) = \bar{x}_1 x_2 \bar{x}_3 x_4 + x_1 \bar{x}_2 x_3 \bar{x}_4 + x_1 \bar{x}_2 x_3 x_4 +$$
$$x_1 x_2 \bar{x}_3 x_4 + x_1 x_2 x_3 \bar{x}_4 + x_1 x_2 x_3 x_4$$
$$= \sum (5, 10, 11, 13, 14, 15).$$

The Karnaugh-map technique for deriving a minimal circuit for the given function requires grouping the cells 400 of the map according to the minterms in the above expression. Once the groupings are formed, the function is easily minimized to:

$$F(x_1, x_2, x_3, x_4) = x_1 x_3 + x_2 \bar{x}_3 x_4.$$

The groupings in the Karnaugh map thus correspond to the prime implicants 402 and 404 of the function. The map pattern is characterized by prime implicants that are adjacent but not overlapped. A hazardous transition 406 may occur whenever there exists a pair of adjacent cells 408 and 410 producing the same output and there is no implicant in the map covering both cells.

Figure 4B:
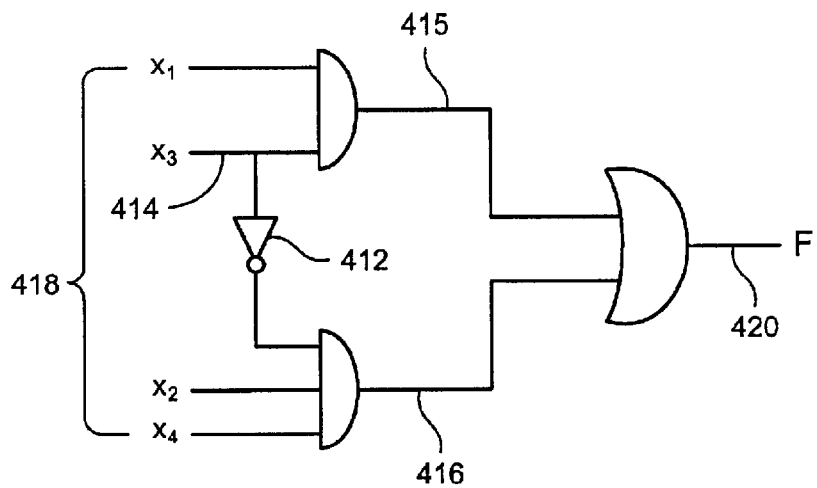
FIG. 4B shows a minimized circuit corresponding to the groupings in the Karnaugh map of FIG. 4A.

FIG. 4B shows a minimized circuit corresponding to the groupings in the example Karnaugh map of FIG. 4A. The example shows a set 418 of four input variables $x_1$, $x_2$, $x_3$, and $x_4$, and a circuit configuration comprising two paths 415 and 416. The circuit has a single output 420. This circuit design contains a static-1 hazard due to the inverter gate 412 applied to the circuit input $x_3$ 414. The presence of the inverter gate 412 adds a propagation delay on the path 416 through the circuit. The propagation delay is thus the origin of the static hazard.

Figure 4C:
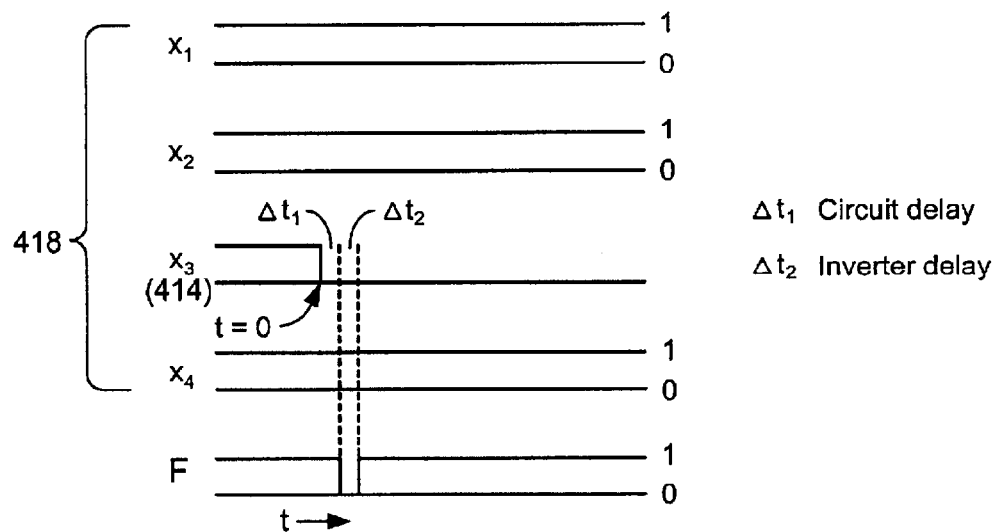
FIG. 4C shows a timing diagram to illustrate the static-1 hazard of FIG. 4B.

FIG. 4C shows a timing diagram to illustrate the static-1 hazard introduced by the presence of the inverter gate 412 of FIG. 4B. At time t<0, the set 418 of circuit inputs $x_1 x_2 x_3 x_4$= 1111, corresponding to cell 410 in the Karnaugh map of FIG. 4A. Therefore, $$F = x_1 x_3 + x_2 \bar{x}_3 x_4 = (1 \wedge 1) \vee (1 \wedge 0 \wedge 1) = 1.$$

Then, at time t=0, the circuit input $x_3$ 714 makes a transition to 0, an intended move to cell 408 in the Karnaugh map of FIG. 4A. A change in the circuit output F will occur after a non-zero circuit delay $\Delta t_1$. However, at time $t=\Delta t_1$, both $x_3$ and the logical complement of $x_3$ have the same logical value of 0, because the inverter gate 412 (FIG. 4B) imposes an extra delay $\Delta t_2$ on the path 416 in the circuit. Thus, at $t=\Delta t_1$, both $x_3$ and its complement have the value 0 and $$F=x_1x_3+x_2\overline{x_3}x_4=(1\wedge 0)\vee(1\wedge 0\wedge 1)=0,$$

manifesting a static 1-hazard. Once the inverter gate 412 has properly complemented $x_3$ at $t=\Delta t_1+\Delta t_2$, the set 418 of circuit inputs $x_1x_2x_3x_4=1101$ and corresponds to the accurate output value of $$F=(1\wedge 0)\vee(1\wedge 1\wedge 1)=1.$$

b. Delay Hazards

Figures 5A, 5B, 5C:
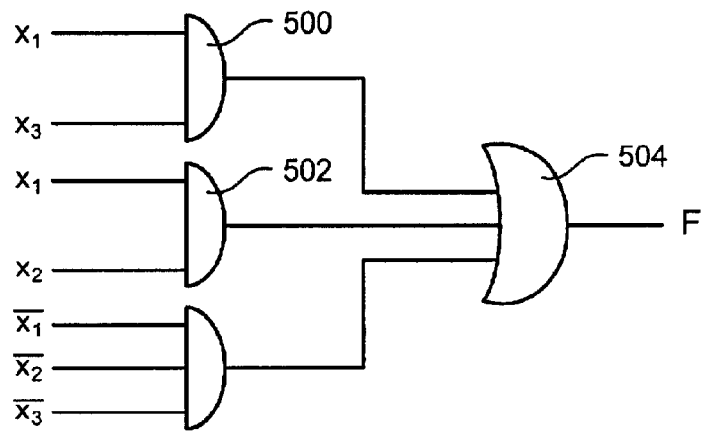
FIG. 5A shows a three-variable Karnaugh map for a circuit with no logic hazard but that will exhibit a delay hazard.
FIG. 5B shows a circuit made of AND-OR logic gates and represented by the Karnaugh map of FIG. 5A, which exhibits a 0101 delay hazard for input changes 011→111→101.
FIG. 5C shows a four-variable Karnaugh map for a circuit with no logic hazard but that will exhibit a delay hazard.

FIG. 5A shows an example of a three-variable Karnaugh map for a circuit with no logic hazard, but that exhibits a delay hazard. The minimized function derived from the groupings in this map is:

$$F(x_1,x_2,x_3,x_4)=\overline{x_1}\overline{x_2}x_3+x_1x_2+x_1x_3.$$

With a delay hazard, a sequence of two consecutive input changes $I_1 \rightarrow I_2 \rightarrow I_3$ can produce the following output sequences:

1. $f(I_1), f(I_2), \overline{f(I_2)}, f(I_3)$ where $f(I_2)=f(I_3)$
2. $f(I_1), f(I_2), f(I_3), f(I_2), f(I_3)$ where $f(I_2) \neq f(I_3)$.

FIG. 5B shows an example circuit made of logic gates, corresponding to the Karnaugh map of FIG. 5A, in which a 0101 delay hazard occurs for input changes 011→111→101. The example corresponds to the first possibility mentioned above. The Fig. depicts a two-stage AND-OR circuit realizing the function $f$ depicted in the groupings of the Karnaugh map of FIG. 5A.

The input sequence (011, 111, 101) should produce the output sequence (0, 1, 1). The initial input change in $x_1x_2x_3$ from 011 to 111 excites both the $x_1x_3$ AND gate 500 and the $x_1x_2$ AND gate 502. Suppose there is a relatively large delay associated with the $x_1x_3$ gate 500. Then it is possible that the $x_1x_2$ gate 502 would go on first; the OR gate 504 might then respond to this signal before the $x_1x_3$ gate 500 goes on, thereby effecting a change in the output. Once the output has changed, the speed-independent circuit allows for a second input change (to 101). The consequence of this input change would be to turn off the $x_1x_2$ gate 502 and the OR gate 504 (hence F), if the delay through the $x_1x_3$ gate 500 is long enough that it has not yet changed to 1. When the $x_1x_3$ gate 500 finally does go on, F will again switch back to 1. Hence, the output sequence will be (0, 1, 0, 1) instead of the expected (0, 1, 1).

Similar to the three-variable map of FIG. 5A, FIG. 5C shows an example of a four-variable Karnaugh map for a circuit with no logic hazard, but that also exhibits a delay hazard. The minimized function derived from the groupings in this Karnaugh map is:

$$F(x_1,x_2,x_3,x_4)=x_1x_2x_4+x_1x_3x_4.$$

Figure 5D:
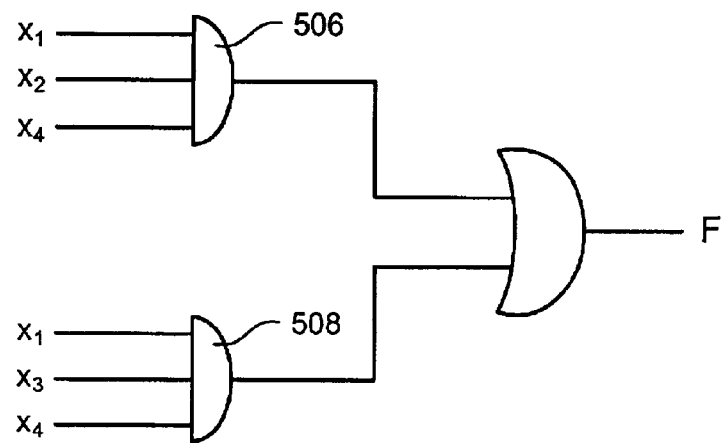
FIG. 5D shows a circuit using AND-OR logic gates and represented by the Karnaugh map of FIG. 5C, which exhibits a 01010 delay hazard for input changes 0111→1111→1110.

FIG. 5D shows a circuit made of logic gates corresponding to the Karnaugh map of FIG. 5C. For this circuit, the input sequence (0111, 1111, 1110) produces the output sequence (0, 1, 0, 1, 0) due to a delay hazard, instead of the expected (0, 1, 0). Using an analysis similar to the previous example, it is easy to visualize that such an output sequence will occur if the delay associated with the AND gate $x_1x_2x_4$ 506 is greater than that with the gate $x_1x_3x_4$ 508.

c. Elimination of Hazards

Figure 6:
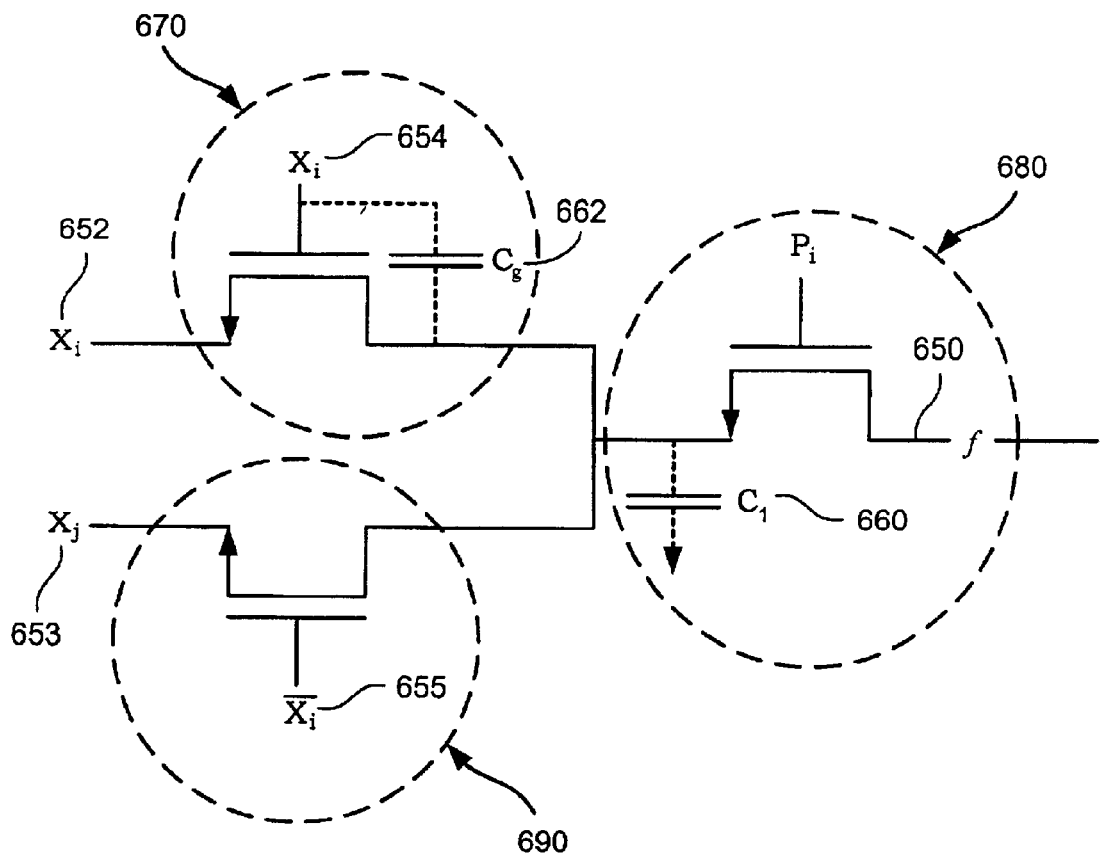
FIG. 6 shows an underlying node configuration for nodes in a BTS pass network of the present invention.

FIG. 6 shows an underlying node configuration for a BTS pass transistor network in an embodiment of the present invention. The node comprises three pass transistors 670, 680, and 690. The following discussion explains a hazard-free property of such a BTS pass transistor network.

For static-0 hazards (or static-1 hazards) to exist in any network, the following two conditions must be present:

1) There is a 1-set (0-set) L of the network, such that $$L=\{a,b,\ldots,x,\overline{x},\ldots,z\},$$

where exactly one variable x appears both complemented and uncomplemented, i.e. the circuit manifests a transient state in which both x and the complement of x have the same value; and 2) there is at least one pair of adjacent input states of the network, corresponding to adjacent cells in the Karnaugh map, with the following properties:
   (a) both input states in the adjacent pair produce 0 (1) outputs;
   (b) the variable x is equal to 0 for one of the input states in the pair and equal to 1 for the other state; and
   (c) each other (non-x) literal of L is equal to 0 (1) for both input states. The present invention shows that a BTS pass transistor network made of binary tree-structured nodes as depicted in FIG. 6 is static-hazard-free even though the above specified conditions are manifested in the circuit. To prove this counter-intuitive statement, refer to FIG. 6 and consider the output $f$650 at a node i in a BTS pass-transistor network:

$$f=P_i[x_i(V_i)+\overline{x_i}(V_j)],$$

where the terms in the expression are as defined in FIG. 6. A change in an input variable of the circuit can either be a change in a pass variable $V_i$ 652 or $V_j$ 653 or a change in control variable $x_i$ 654 or $\overline{x}_i$ 655.

When the control variables $x_i$ 654 and $\overline{x}_i$ 655 remain the same and a pass variable $V_i$ 652 or $V_j$ 653, changes, the output $f$650 will change accordingly and with no spurious transient output. This is because the control variables $x_i$ 654 and $\overline{x}_i$ 655 are logical complements of each other, so that only one path from the pass variables $V_i$ 652 and $V_j$ 653 to the output $f$650 will ever be active at any one time. However, if a change in an input variable effects a change in a control variable, a time lag between the switching of the control variables $x_i$ 654 and $\overline{x}_i$ 655 can give rise to the following two cases:

Case 1: $x_i=\overline{x}_i=1$.

From the definition of a static hazard a first pass variable $V_i$ 652 has the same logical value as a second pass variable $V_j$ 653 (either both 0 or both 1). If both paths are active, the BTS node output $f$1150 will remain at value $V_i$, so there will be no hazard.

Case 2: $x_i=x_i=\overline{x}_i=0$.

The output $f$1150 in this case remains in its previous state since all the pass transistors are offering high impedance and the output node will retain its charge during the switching period. The only requirement for the output branch of the circuit to retain its charge is that the capacitance $C_1$ 660 should be greater than the gate drain capacitance $C_g$ 662.

Pass transistor logic, which may have the three states "0," "1," and "Z," will thus lead to a high impedance state during a single input transition. This is unlike gate logic, which may have only the two states "0" and "1," thereby causing a spurious transient output to occur during switching if a redundant gate is not added to eliminate the static hazard. Thus, after reading this disclosure, it will be apparent to a person of ordinary skill in the art that in a BTS pass transistor network made according to embodiments of the present invention, the binary tree-structured property of the node output function $f$ will not change when both $x_i$ and its complement momentarily have the same value (either both 1 or both 0).

FIGS. 7A, 7B, and 7C illustrate a method of eliminating static, dynamic and delay hazards in a circuit made of pass transistors. In some embodiments, the circuit is a combinational circuit. The operational behavior of the circuit is described by a plurality of input variables, in this example $\{x_1, x_2, x_3, x_4\}$ and at least one network output expression formed of the input variables. The method initially comprises deriving a network pass function F from each one of the network output expressions, the function having a sum-of-products form such that $$F = \sum_{i=1}^{n} P_i(V_i).$$

Here, n represents a number less than or equal to the total number of permutations on the set of input variables, $P_i$ represents a control pass function for a set i of pass transistors to be used in the circuit, and $V_i$ represents a pass variable for the set i of pass transistors. Each product term $P_i(V_i)$ in the sum-of-products form of the function thus forms a pass implicant for the network pass function.

Once this pass function has been derived, it is factored into a binary tree-structured form, representing a binary tree where each node has exactly two input branches and exactly one output branch, the output branch being described by a node output function $f$ of the form $$f = P_i[x_i(V_i) + \bar{x}_i(V_j)].$$

Here, a first control pass function $x_i$ for a first pass variable $V_i$ at one input branch of the node is a logical complement of a second control pass function for a second pass variable $V_j$ at the other input branch of the node.

Finally, the method constructs the circuit using pass transistors according to the binary tree structure of the network pass function.

FIG. 7A shows an example Karnaugh map corresponding to a BTS solution to the static-1 hazard of FIG. 4A. In an embodiment, the method of the present invention proposes that the in designing a BTS network pass expression, the pass implicants, denoted in this example by 700, 702, and 704, not overlap in the BTS Karnaugh map representing the circuit output function. If a pass expression with overlapping pass implicants is factored, then the circuit will not correspond to a BTS pass transistor network since overlapping implicants signifies that more than two branches join at a single node in the circuit. This differs from the prior art in which hazards in combinational circuits are overcome through the use of overlapping pass implicants.

The Karnaugh map in FIG. 7A shows a suitable implementation of BTS logic in accordance with an embodiment of the invention. In this map, cells 0, 4, 8, and 12 denote a pass implicant 700 with the pass variable $x_1$. The complete pass network (non-BTS) could thus be expressed as $$F(x_1,x_2,x_3,x_4) = \bar{x}_3\bar{x}_4(0) + \bar{x}_3 x_4(x_2) + x_3(x_1).$$

A BTS pass network expression can be derived from the above expression by factoring the complement of $x_3$ out of the first two pass implicants:

$$F(x_1,x_2,x_3,x_4) = \bar{x}_3[\bar{x}_4(0) + x_4(x_2)] + x_3(x_1).$$

Accordingly, FIG. 7B shows a resulting BTS pass transistor network realization of the Karnaugh map of FIG. 7A. The pass network is constructed such that $$V_i = \{0, 1, x_1, \bar{x}_1, x_2, \bar{x}_2, \ldots, x_n, \bar{x}_n\}.$$

The pass network can thus take advantage of this larger set of potential pass variables to derive a circuit. In this illustration, BTS nodes 706 and 708 correspond to a summation term in the factored BTS pass function and circuit output F 710. Note that in this exemplary BTS pass transistor network, a first input branch 712 to node 706 is controlled by $x_4$ 718. This control structure is again present at node 708, where a first branch 722 is controlled by a logical complement 723 of the control variable on a second branch 724. This type of complementary control structure the BTS pass transistor networks used in embodiments of the invention. After reading this disclosure, it will be apparent to a person of ordinary skill in the art this control structure permits only one path from the circuit input leads to each of the circuit output leads to be a low-impedance path for a given set of values applied to the inputs. In the example of FIG. 7B, the circuit input leads are denoted 720 and the circuit output lead is denoted 710.

FIG. 7C shows a timing diagram illustration of how the BTS pass network of FIG. 7B eliminates the static-1 hazard of FIG. 4A. Since the pass logic has three states ("0," "1," and "Z") the output F 710 will have a high impedance state during a single input transition. This is unlike the gate logic of the prior art, which has only two states "0" and "1," causing a spurious transient output to occur during switching if a redundant gate is not added to the circuit. For example, the timing diagram of FIG. 7C shows the following. At time $t = \Delta t_1$, the circuit inputs 720 are $x_1 x_2 x_3 x_4 = 1111$, corresponding to cell 15 in the Karnaugh map of FIG. 7A. Since $$F(x_1,x_2,x_3,x_4) = \bar{x}_3[\bar{x}_4(0) + x_4(x_2)] + x_3(x_1),$$

the output F 710 will be (Z)+1(1). Then, at time t=0, $x_3$ 725 makes a transition from 1 0 to 0, corresponding to a move to cell 12 in the Karnaugh map of FIG. 7A. At a time $t = \Delta t_1$, the output F 710 is still equal to 1, since both $x_3$ and its logical complement are 0 due to the inverter delay $\Delta t_2$; thus, both path 722 and path 724 are high-impedance paths in the BTS pass transistor logic circuit and the output F 710 retains its initial value of 1. After the second time delay $\Delta t_2$, corresponding to the delay through the inverter on $x_3$, the output is again F=1[Z+1(1)]+Z=1.

While the example shown above shows there is no static 1-hazard, it will be apparent to a person of ordinary skill in the art after reading this disclosure that similar arguments are applicable for static 0-hazards. Accordingly, there are no static hazards in a BTS pass transistor network made according to such embodiments of the present invention. Specifically, embodiments of the invention include universal-logic-gate cells that have no static hazards.

Figure 8A:
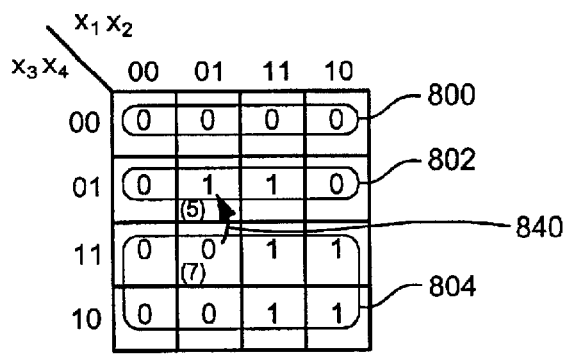
FIG. 8A shows an example of a BTS Karnaugh map of the present invention, corresponding to a BTS solution to a dynamic hazard and similar to the example Karnaugh map of FIG. 7A.

FIG. 8A shows a Karnaugh map corresponding to a BTS solution to a dynamic hazard and is similar to the example Karnaugh map of FIG. 7A. In general, BTS pass transistor networks according to embodiments of the invention have no overlapping pass implicants in their Karnaugh map representations, such as pass implicants 800, 802, and 804 in FIG. 8A. It is this aspect of the BTS pass transistor network design method in embodiments of the present invention that is used to obtain circuits free of dynamic hazards.

As was done in the discussion of static hazards, consider the output at a node i in the BTS pass transistor network, $$f = P_1[x_i(V_i) + \bar{x}_i(V_j)].$$

A change in an input variable can either be a change in one of the control variables, i.e. $x_i$ or its complement, or a change in one of the pass variable, i.e. $V_i$ or $V_j$). If the input change causes a change in a pass variable, then the active path remains the same because neither of the control variables have changed, and the change in the pass variable is reflected at the output after a certain time lag. In such a situation, there will be no spurious transient occurring at the output.

However, if the input change causes a change in a control variable, then both $x_i$ and its complement can momentarily have the same logical value, either both 1 or both 0, because of a non-zero time delay through an inverter that forms the logical complement. Two cases are then possible:

Case 1: $x_i = \bar{x}_i = 0$.

In this first case, the output retains its previous state during the switching time lag since all the paths to the output are in a high impedance state. Thus, when the active path finally shifts to a new path, the output changes to its complement and there is no spurious transient change of the output associated with the change in the control variable.

Case 2: $x_i \bar{x}_i = 1$.

In this second case, the path controlled by $x_i$ switches faster than the previously active path controlled by the logical complement of $x_1$. This situation gives rise to an intermediate voltage at the node output $f$ while both input branches are active. The output state $f$ of the node will eventually switch to the complement of its previous value after the pass transistor in the previously active path has turned off.

Thus, there will be no dynamic-hazard sub-sequence occurring at the output $f$ of the node between transitions in the input variables. The fact that a change in any one input variable that causes the output to change will not give rise to a dynamic hazard has general validity in embodiments of the invention. Accordingly, such embodiments include pass-transistor-based universal-logic-gate library cells that do not exhibit dynamic hazards.

Figure 8B:
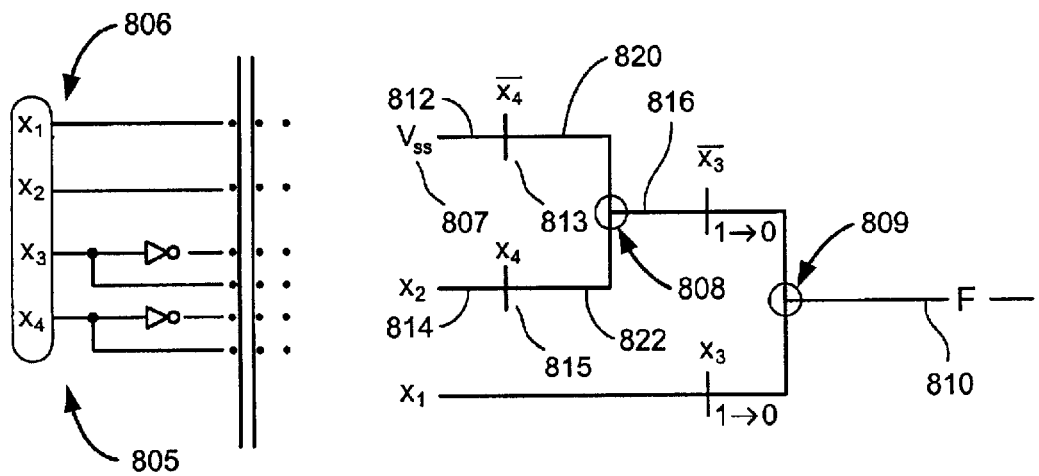
FIG. 8B shows a BTS pass transistor logic circuit represented by the BTS Karnaugh map of FIG. 8A.

FIG. 8B shows a BTS pass transistor logic circuit represented by the Karnaugh map of FIG. 8A. In one embodiment, the BTS logic circuit comprises a plurality of input leads 805 so that a first set 806 of input values may be applied to the input leads, and at least one output lead F 810, such that a state of each output lead can be described by a pass network function in the sum-of-products form $$F = \sum_{i=1}^{n} P_i(V_i).$$

In this expression, n is an integer less than or equal to the number of permutations on the set of input values, $P_i$ represents a control pass function for a set i of the pass transistors used in the circuit, and $V_i$ represents a pass variable for the set i of pass transistors. Each product term $P_i(V_i)$ thus forms a pass implicant for the network pass function. The $V_{ss}$ input 807 to the example BTS pass transistor logic circuit depicted in the FIG. 8B corresponds to a desired steady-state output value for the circuit.

In embodiments of the present invention, the BTS pass transistor logic circuit is constructed from binary tree nodes, denoted in this example 808 and 809. Each node includes two pass transistors, such as transistors 813 and 815 at node 808 that create exactly two input branches 812 and 814. The first input branch 812 corresponds to an input lead to one pass transistor 813 and the second input branch 814 corresponds to an input lead to the second pass transistor 815. Furthermore, at each node in the BTS pass transistor logic circuit there is exactly one output branch. For example, the circuit illustrated by FIG. 3B comprises two nodes 808 and 809—branch 816 is the output lead of node 808 and also one of the input leads to node 809, and branch 810 is the output lead of node 809 and also the output lead for the circuit as a whole.

The output branch at each node in the BTS pass transistor logic circuits used in embodiments of the invention is created by joining a first output lead of one pass transistor at the node to a second output lead of the other pass transistor. For example, in this illustration, the output lead 816 from node 808 is created by joining output leads 820 and 822 of transistors 813 and 815 respectively. In addition to input leads and output leads, each binary node in the BTS pass transistor logic circuit may include two control inputs: a first control input applied to the control terminal of the first pass transistor, whereby the first input value is passed through the first pass transistor according to this first control input; and a second control input applied to the control terminal of the second pass transistor, whereby the second input value is passed through the second pass transistor according to this second control input. The nodes may also be connected in such a manner as to create no more than one low-impedance path from the circuit's input leads to each one of the circuit's output leads for any possible set of input values applied to the circuit's input leads.

In one embodiment of the present invention, each node in the BTS pass transistor logic circuit includes two control inputs, where one control input is a logical complement of the other. Furthermore, the state of the output branch is described by a node output function of the form $$f = P_i[x_i(V_i) + \bar{x}_i(V_j)],$$

where the control pass function $x_i$ for a first pass variable $V_i$ at the first input branch of the node is the logical complement of a second control pass function for a second pass variable $V_j$ at the second input branch of the node.

Figure 8C:
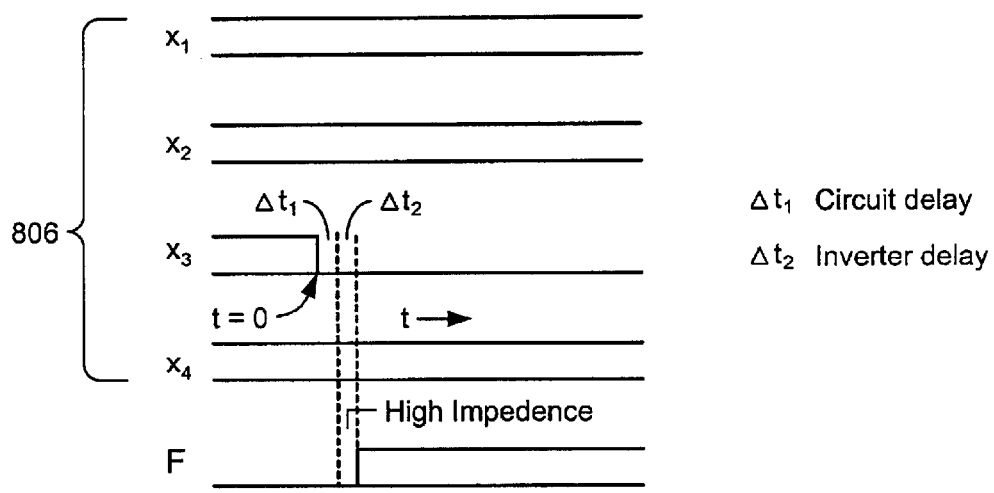
FIG. 8C shows a timing diagram illustration of how the BTS pass network of FIG. 8B avoids a dynamic hazard.

The dynamic-hazard-free property of BTS pass transistor networks made according to embodiments of the invention can thus be described by referring to the specific example illustrated in FIGS. 8A, 8B, and 8C. A transition 840 from cell 7 in the Karnaugh map of FIG. 8A to cell 5 would manifest a dynamic hazard in a classical gate logic circuit of the prior art, but is eliminated in embodiments of the present invention. FIG. 8C shows a timing diagram illustration of the dynamic hazard for the transition between cell 7 and cell 5 in the Karnaugh map of FIG. 8A. FIG. 8C represents a case where $x_3$ and its complement are momentarily 0. At time t<0, the circuit inputs 806 $x_1 x_2 x_3 x_4 = 0111$, corresponding to cell 7 in the Karnaugh map of FIG. 8A. Therefore, $$F(x_1, x_2, x_3, x_4) = \bar{x}_3[\bar{x}_4(0) + x_4(x_2)] + x_3(x_1)$$

$$= (Z) + 1(0) = 0.$$

Then, at time t=0, $x_3$, makes a transition 840 from 1 to 0, corresponding to a move to cell 5 in the Karnaugh map. After a short circuit delay $\Delta t_1$, the output F 810 at time $t = \Delta t_1$ remains at its previous value, in this case 0, because of the time lag $\Delta t_2$ introduced by an inverter that forms the complement of $x_3$, which controls the switching from one active path to another. Thus, at time $t=\Delta t_1+\Delta t_2$, the output function 810 is F=1[Z+1(1)]+Z=1.

Hence, there is no dynamic hazard associated with the BTS pass transistor logic circuits made according to embodiments of the invention, including in the universal logic gate cells described above. After reading this disclosure, it will be apparent to a person or ordinary skill in the art that the same analysis and conclusion can be made for state transitions in which a control variable changes from 0 to 1. Pass transistor logic circuits made in accordance with embodiments of the invention to implement a pass network expression F having the property that one and only one control pass variable is active at a given time are static- and dynamic-hazard-free. This is true, in particular, for pass-transistor implementations of the universal logic gate elements described above.

Figure 9A:
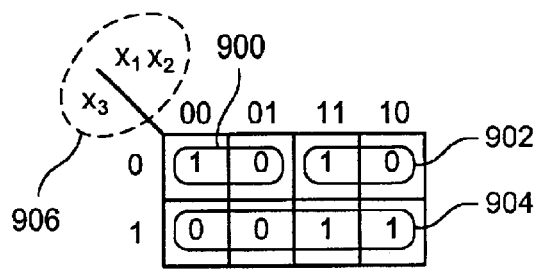
FIG. 9A shows an example of a BTS Karnaugh map of the present invention, corresponding to the same logic function as FIG. 5A.

FIG. 9A shows an example of a BTS Karnaugh map corresponding to the same logic function as FIG. 5A. The cell groupings 900, 902, and 904 in the map do not overlap and correspond to pass implicants of the pass function $$F(x_1,x_2,x_3,x_4)=x_3(x_1)+\bar{x}_3\bar{x}_1(\bar{x}_2)+\bar{x}_3 x_1(x_2).$$

After factoring the last two pass implicants in the above pass function, it takes the form $$F(x_1,x_2,x_3,x_4)=x_3(x_1)+\bar{x}_3[\bar{x}_1(\bar{x}_2)+x_1(x_2)].$$

Figure 9B:
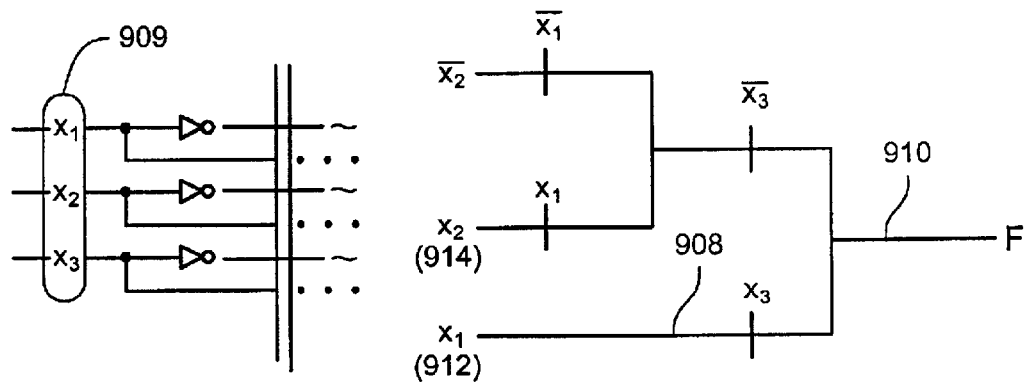
FIG. 9B shows a BTS pass transistor logic circuit corresponding to the BTS Karnaugh map of FIG. 9A, which eliminates the delay hazard found in the classical AND-OR logic gate implementation of FIG. 5B.

FIG. 9B shows a BTS pass transistor logic circuit corresponding to the example BTS Karnaugh map of FIG. 9A. The delay-hazard-free property of BTS pass transistor networks made in accordance with embodiments of the invention may be illustrated by comparing the pass-network implementation of this function with the logic-gate implementation shown in FIG. 5B. In this example, the delay hazard for the logic-gate-based circuit occurs for input changes 011→111→101, but is absent from the pass-resistor implementation.

The absence of a delay hazard may be seen be considering the set of values 909 to be applied to the input variables $x_1 x_2 x_3=011$, so that the active path in the network is $x_3(x_1)$ 908 and the output F 1410 is 0. When the set of input values changes from 011 to 111, a change only occurs in the value applied to $x_i$ 912, which is a pass variable for the active path 908. Hence, the active path 908 remains the same, and the pass variable change from 0 to 1 is reflected in the output after a certain time lag. The circuit is thus stable and ready for the next change. When the input then changes from 111 to 101, the change again only occurs in a single pass variable, this time $x_2$ 914, and the active path 908 remains the same. The sequence of values produced at the output F 910 is (0, 1, 1), which does not exhibit the spurious transient output value that had been associated with a delay hazard in the equivalent combinational circuit made of classical logic gates of FIG. 5B.

Thus, in a BTS pass transistor logic circuit of the present invention, including pass-transistor-based universal logic gate cell elements, a sequence of consecutive input changes $I_1 \rightarrow I_2 \rightarrow I_3 \rightarrow \ldots \rightarrow I_n$ always produces the required output sequence of $F(I_1), F(I_2), F(I_3), \ldots, F(I_n)$ without having any unwanted change in the output sequence. As mentioned before, in a BTS pass transistor network, an input change can be either a change in a pass variable or a change in a control variable. If the pass variable changes, then that change is reflected in the output depending on the propagation delay associated with each transistor; once the output has stabilized, the circuit is ready for the next change, since there is ever only one active path to the output. If the control variable changes then the output attains a new value only after the pass transistor in the new path has fully turned on. So, once again, there is only one active path and the circuit is stable when the output is stabilized.

After reading this disclosure, it will thus be apparent to a person of ordinary skill in the art that BTS pass transistor logic circuits made in accordance with the embodiments of the present invention, including pass-transistor-based universal logic gate elements, are delay-hazard-free. In such logic circuits, only a single path is enabled to the output for any given input set of values; therefore, as soon as the output has stabilized, one is assured that the interior of the circuit has also stabilized. Hence, the input can be permitted to change after the output has attained a stable state, without any possibility of a delay hazard.

Figure 9C:
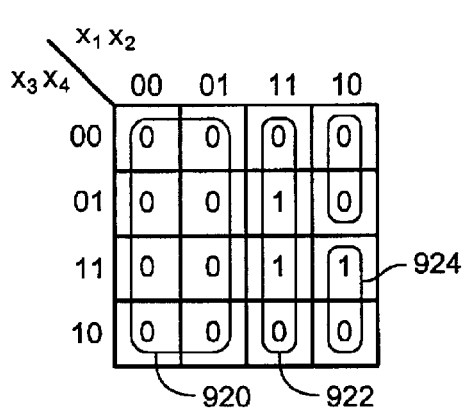
FIG. 9C shows a four-variable BTS Karnaugh Map of the present invention, corresponding to the same logic function as FIG. 5C.

FIG. 9C shows a four variable BTS Karnaugh Map corresponding to the same example logic function as in the classical Karnaugh Map of FIG. 5C. The cell groupings 920, 922, and 924 do not overlap and correspond to pass implicants of the network pass expression $$F(x_1,x_2,x_3,x_4)=\bar{x}_1(0)+x_1 x_2(x_4)+x_1\bar{x}_2\bar{x}_3(0)+x_1\bar{x}_2 x_3(x_4),$$

which, after factoring, provides the BTS pass function $$F(x_1,x_2,x_3,x_4)=\bar{x}_1(0)+x_1[x_2(x_4)+\bar{x}_2[\bar{x}_3(0)+x_3(x_4)]].$$

Figure 9D:
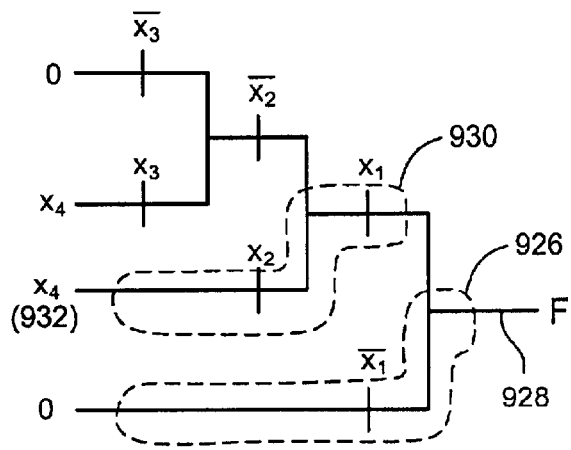
FIG. 9D shows an example BTS pass transistor logic circuit corresponding to the BTS Karnaugh map of FIG. 9C, which eliminates the delay hazard found in the classical AND-OR logic gate implementation of FIG. 5D.

FIG. 9D shows an example BTS pass transistor logic circuit, corresponding to the example Karnaugh map of FIG. 9C, for which there is also no logic or delay hazard. This may be illustrated by considering the input sequence (0111, 1111, 1110), for which the output sequence is (0, 1, 0). The input set $x_1 x_2 x_3 x_4=0111$ excites only one path 926, corresponding to the complement of $x_1$ and the output F 928 is 0; the circuit is in a stable state as soon as the output has stabilized. When the set of input values is changed to 1111, a new path 930 corresponding to $x_1 x_2(x_4)$ has a pass variable $x_4$ 932, which has the value 1. The output F 928 also changes to 1. Once again, when the set of input values is permitted to change to $x_1 x_2 x_3 x_4=1110$, the output F 928 changes to 0, since the pass variable $x_4$ 932 has changed to 0. The output F 928 remains stable until the next change. Thus, the output sequence is (0, 1, 0), which does not exhibit the delay-hazard sequence of 01010 associated with the combinational circuit made of gate logic and depicted in FIG. 5C.

Thus, after reading this disclosure, it will be apparent to a person of ordinary skill in the art that pass networks made according to embodiments of the invention to implement a pass network expression F with the property that only one pass variable is active at a given time are delay-hazard-free. This is true, in particular, for pass-transistor-based universal logic gate elements made in accordance with embodiments of the invention.

5. Speed-Independent Logic Circuits

Figure 10A:
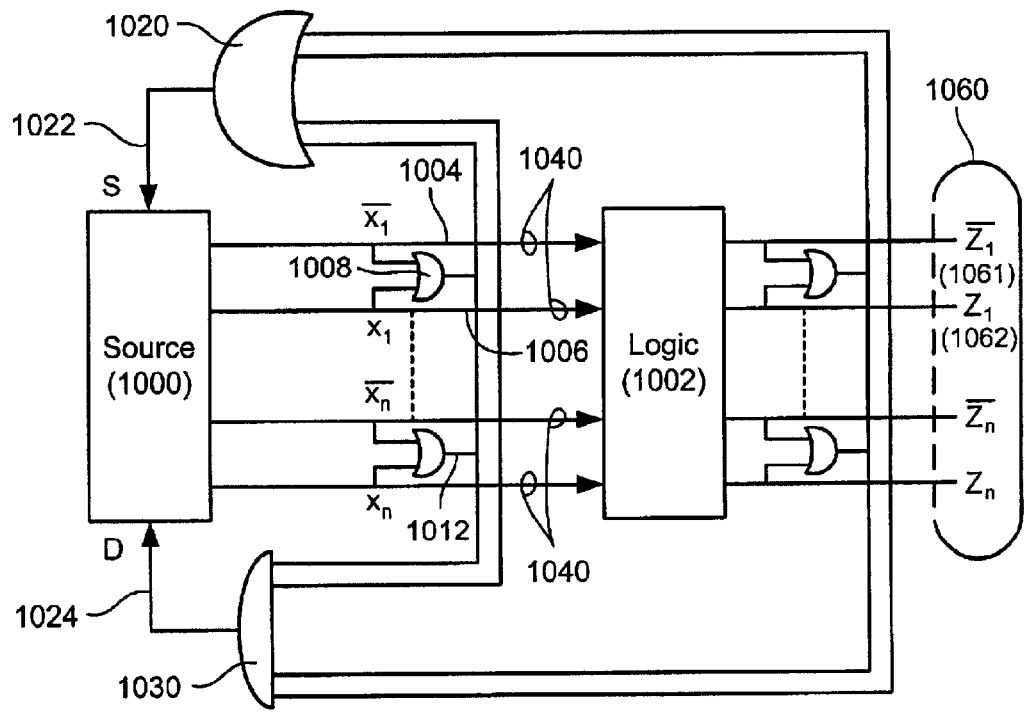
FIG. 10A shows a block diagram of a combinational circuit using a gate logic in a spacer-data word approach to eliminating delay hazards in speed independent circuits.
Figure 10B:
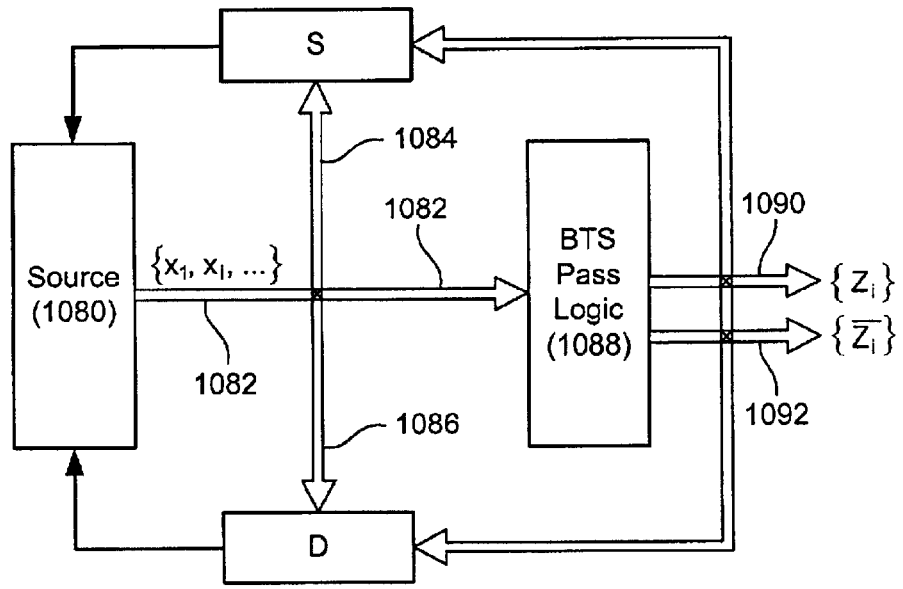
FIG. 10B shows a block diagram of a speed independent circuit using BTS logic in a spacer-data word approach to eliminating delay hazards.

Certain aspects of embodiments of the invention are further illustrated in FIGS. 10A and 10B, which compare spacer-data-word approaches to a gate-logic implementation of a speed-independent circuit with a speed-independent circuit made according to embodiments of the invention. FIG. 10A shows a block diagram for a combinational circuit generating returning signals. The figure illustrates the overall block diagram for a speed independent circuit design that does not use pass logic to implement a spacer-data word approach to eliminating delay hazards in speed-independent circuits.

To understand how the spacer-data word approach works, and especially how it is limited by the prior art, it is helpful to step through the behavior of the circuit as it is depicted in FIG. 10A, with all circuit logic in block 1002 implemented using classical AND-OR logic gates. At time t=0, an input source 1000 emits a spacer word so that all $x_i$ and their complements are set to 0, this situation persisting until all the logic gates (not shown) in the logic block 1002 emit 0-signals. Then S 1022, which is the output of the upper OR gate 1020, and D 1024, which is the output of the lower AND gate 1030, both become 0. These signals are then interpreted by the source 1000 as a request from the logic block 1002 for a new data word. Consequently, the source 1000 emits a data word using a spacer-data encoding rule, and the effect is that 1-signals are generated by some of the logic gates (not shown) in the logic block 1002, causing either $Z_i$ 1062 or $\overline{Z}_i$ 1061 to go on. When this process is complete, the output 1060 corresponds to a data word and eventually D 1024 is turned on. In the meantime, S 1022 is also turned on. The source 1000 interprets S=D=1 as a request for a new spacer word, and thus all $x_i$ inputs 1040 and their complements are again set to 0 accordingly. When this occurs, a spacer word is supplied by the source 1000 and the entire process is repeated.

Using AND-OR gates within the logic block fails to avoid delay hazards because the delay at the output of one of the AND gates (not shown) and feeding into a $Z_i$ OR gate may be significant; a 1-signal may not get through that delay until after the next spacer and the next input data are produced. This delay problem may be avoided by imposing a restriction that for any data input, exactly one AND gate in the circuits generating $Z_i$ and its complement be allowed to be turned on. In such an instance, when S 1022 and D 1024 both go from 1 to 0, the only AND gates that were on must have gone off. When a data input is fed to the logic block 1002, exactly one AND gate eventually goes on for each output pair ($Z_i$, $\overline{Z}_i$). This approach is undesirable, however, because it involves imposing logic constraints that increase the overall complexity of the circuit.

By contrast, FIG. 10B shows a block diagram of a corresponding speed independent circuit that uses a BTS pass transistor network in a spacer-data word approach to eliminate delay hazards in accordance with an embodiment of the invention. In such an embodiment, the speed independent circuit uses pass logic in the logic block 1088 as part of a double rail method of eliminating delay hazards in a speed-independent circuit. One embodiment, including that shown in FIG. 10B, is characterized in two ways. First, to produce a complemented output from the pass network, one only has to complement all of the pass variables. Second, when a spacer word is presented to the logic block 1088, all the pass transistors (not shown) will turn off and the output of the pass network will produce a high impedance output. This may be true either for a BTS or a regular pass network having the property that only one path is active for any set of input values. Since the circuit output needs to be 0 in response to a spacer word, the pass network may include a pull down path to logic 0.

Hence, embodiments that eliminates delay hazards in a speed-independent circuit include: (1) an input source 1080 that generates both data words and spacer words; and (2) a pass transistor logic block 1088 having the property that there exists only one low-impedance path through the logic block for any possible data word generated by the source 1080 and supplied to the pass transistor logic block 1088. In one embodiment, a data word is encoded by transmitting each input variable in double rail fashion on two lines 1084 and 1086 and the spacer word is encoded by all zeros. The circuit may include a plurality of input leads 1082 from the input source 1080 to the pass transistor logic block 1088 and a plurality of output leads 1092 and 1092 from the pass transistor logic block 1088. The output leads may include two sets, a first set 1090 having output values that are the logical complement of a second set 1092 of output values.

Having described several embodiments, it will be recognized by those of skill in the art that various modifications, alternative constructions, and equivalents may be used without departing from the spirit of the invention. Accordingly, the above description should not be taken as limiting the scope of the invention, which is defined in the following claims.

What is claimed is:

1. A pass transistor network for implementing a pass network function, the pass transistor network comprising:

a plurality of ordered arrangements of pass transistors laid out from a position corresponding to an output of the pass transistor network, wherein each such ordered arrangement comprises a plurality of pass transistors corresponding to a logical decomposition of the pass network function and wherein the plurality of ordered arrangements are laid out substantially radially from the position.

2. The pass transistor network recited in claim 1 wherein no more than one of the ordered arrangements may be active at any time.

3. The pass transistor network recited in claim 1 wherein the logical decomposition is about two logical variables and the plurality of ordered arrangements define layout quadrants.

4. The pass transistor network recited in claim 1 wherein the logical decomposition is about three logical variables and the plurality of ordered arrangements define layout octants.

5. The pass transistor network recited in claim 1 wherein:

at least one of the ordered arrangements includes a sub-network of pass transistors, the sub-network comprising a plurality of ordered sub-arrangements laid out substantially radially from a position corresponding to an output of the sub-network; and each such ordered sub-arrangement includes a plurality of pass transistors corresponding to a logical decomposition of a factor of the pass network function.

6. The pass transistor network recited in claim 1 wherein the output of the pass transistor network corresponds to a selected one of a plurality of inputs provided to the pass transistor network.

7. The pass transistor network recited in claim 1 wherein at least one of the ordered arrangements includes a sub-network comprising a binary tree structure of pass transistors having a plurality of nodes, each such node comprising:

first and second input branches, wherein the first input branch provides a first input value to a first pass transistor and the second input branch provides a second input value to a second pass transistor;

an output branch created by joining outputs from the first and second pass transistors; and first and second control inputs applied to control terminals of the first and second pass transistors, whereby the first input value is passed through the first pass transistor according to the first control input and the second input value is passed through the second pass transistor according to the second control input.

8. A library of logic cells, wherein at least one of the logic cells comprises the logic element recited in claim 1.

9. A logic element comprising:

a memory element;

a buffer element; and a selection circuit operationally connected with the memory element and buffer element, the selection circuit comprising a network of pass transistors distributed to implement a pass network function for selecting at least one of a plurality of inputs to transmit as an output, wherein the network comprises a plurality of ordered arrangements laid out substantially radially from a position corresponding to the output, each such ordered arrangement comprising a plurality of pass transistors corresponding to a logical decomposition of the pass network function, wherein the selection circuit is free of at least one of a static hazard, a dynamic hazard, and a delay hazard.

10. The logic element recited in claim 9, wherein the network comprises a binary tree structure of pass transistors having a plurality of nodes, each such node comprising:

first and second input branches, wherein the first input branch provides a first input value to a first pass transistor and the second input branch provides a second input value to a second pass transistor;

an output branch created by joining outputs from the first and second pass transistors; and first and second control inputs applied to control terminals of the first and second pass transistors, whereby the first input value is passed through the first pass transistor according to the first control input and the second input value is passed through the second pass transistor according to the second control input.

11. The logic element recited in claim 10, wherein the second control input is a logical complement of the first control input.

12. The logic element recited in claim 9 wherein the selection circuit is free of each of the static hazard, the dynamic hazard, and the delay hazard.

13. The logic element recited in claim 9 wherein no more than one of the ordered arrangements may be active at any time.

14. The logic element recited in claim 9 wherein the logical decomposition is about two logical variables and the plurality of ordered arrangements define layout quadrants.

15. The logic element recited in claim 9 wherein the logical decomposition is about three logical variables and the plurality of ordered arrangements define layout octants.

16. The logic element recited in claim 9 wherein:

at least one of the ordered arrangements includes a sub-network of pass transistors, the sub-network comprising a plurality of ordered sub-arrangements laid out substantially radially from a position corresponding to an output of the sub-network; and each such ordered sub-arrangement includes a plurality of pass transistors corresponding to a logical decomposition of a factor of the pass network function.

17. A library of logic cells, wherein at least one of the logic cells comprises the logic element recited in claim 9.

18. A method for implementing a logical function, the method comprising:

decomposing the logical function about a plurality of logical variables to identify factors corresponding to combinations of the plurality of logical variables and complements of the plurality of logical variables;

providing a network having a plurality of ordered arrangements of pass transistors laid out from a position corresponding to an output of the logical function, each such ordered arrangement corresponding to one of the combinations, wherein the plurality of ordered arrangements of pass transistors are laid out substantially radially from the position; and for each of the factors, providing a sub-network in communication with the ordered arrangement corresponding to such each of the factors to implement such each of the factors.

19. The method recited in claim 18 wherein the sub-network comprises a network of pass transistors.

20. The method recited in claim 19 wherein providing the sub-network comprises:

decomposing the corresponding factor about a second plurality of logical variables; and providing a plurality of ordered sub-arrangements of pass transistors laid out substantially radially from a position corresponding to an output of the sub-network, each such ordered sub-arrangement corresponding to combinations of the second plurality of logical variables and complements of the second plurality of logical variables.

21. The method recited in claim 19 wherein providing the sub-network comprises providing a binary tree structure of pass transistors having a plurality of nodes, each such node comprising:

first and second input branches, wherein the first input branch provides a first input value to a first pass transistor and the second input branch provides a second input value to a second pass transistor;

an output branch created by joining outputs from the first and second pass transistors; and first and second control inputs applied to control terminals of the first and second pass transistors, whereby the first input value is passed through the first pass transistor according to the first control input and the second input value is passed through the second pass transistor according to the second control input.

* * * * *